United States Patent [19]

Kobayashi

[11] Patent Number: 6,097,597
[45] Date of Patent: Aug. 1, 2000

[54] THERMO-SIPHON AND MANUFACTURING METHOD OF THERMO-SIPHON AND INFORMATION PROCESSING APPARATUS

[75] Inventor: Takashi Kobayashi, Tokyo, Japan

[73] Assignee: Mitsubishi Denki Kabushiki Kaisha, Tokyo, Japan

[21] Appl. No.: 09/205,093

[22] Filed: Dec. 3, 1998

[30] Foreign Application Priority Data

Jun. 30, 1998 [JP] Japan .................................. 10-183562
Jun. 30, 1998 [JP] Japan .................................. 10-183563

[51] Int. Cl.$^7$ .............................. H05K 7/20; F28D 15/00
[52] U.S. Cl. .......................... 361/687; 361/696; 361/697; 361/717; 62/259.2; 165/80.5; 165/104.33
[58] Field of Search ........................... 361/687, 694–703, 361/717–719; 437/209, 221, 222; 438/106, 118, 584, 675; 364/708.1; 29/832, 841, 854, 729, 739; 62/259.2; 165/80.3, 104.33, 80.4, 185, 104.21–104.26, 80.51

[56] References Cited

U.S. PATENT DOCUMENTS

| | | | |
|---|---|---|---|
| 4,551,787 | 11/1985 | Mittal et al. ............................. | 361/387 |
| 4,712,158 | 12/1987 | Kikuchi et al. ......................... | 361/385 |
| 5,513,070 | 4/1996 | Xie et al. ................................ | 361/700 |
| 5,588,483 | 12/1996 | Ishida . | |
| 5,606,341 | 2/1997 | Aguilera .................................... | 345/87 |
| 5,621,613 | 4/1997 | Haley et al. ............................. | 361/687 |
| 5,634,351 | 6/1997 | Larson et al. .......................... | 62/259.2 |
| 5,646,822 | 7/1997 | Bhatia et al. ........................... | 361/687 |
| 5,764,483 | 6/1998 | Ohashi et al. .......................... | 361/699 |
| 5,781,409 | 7/1998 | Mecredy, III ........................... | 361/687 |
| 5,822,187 | 10/1998 | Garner et al. ........................... | 361/687 |
| 5,847,925 | 12/1998 | Progl et al. ............................. | 361/687 |
| 5,966,286 | 10/1999 | O'Connor et al. ...................... | 361/699 |

FOREIGN PATENT DOCUMENTS

0702287-A2 3/1996 European Pat. Off. .
58-7076 1/1983 Japan .

OTHER PUBLICATIONS

Patent Abstract of Japan, Japanese Patent Document No. 8-87354, published Apr. 2, 1996.
Patent Abstracts of Japan, Japanese Patent Document No. 8-204373, published Aug. 9, 1996.
Patent Abstract of Japan, Japanese Patent Document No. 8-261672, published Oct. 11, 1996.
Patent Abstract of Japan, Japanese Patent Document No. 9-6481, published Jan. 10, 1997.

*Primary Examiner*—Leo P. Picard
*Assistant Examiner*—Anatoly Vortman
*Attorney, Agent, or Firm*—Burns, Doane, Swecker & Mathis, LLP

[57] ABSTRACT

The present invention aims to reduce as much as possible the weight of the thermo-siphon being used in spreading heat of the mobile information processing apparatus. The heat spreading board 5 and the thermo-siphon 6 is installed at the lid 51 of the notebook type personal computer, and the heat from the CPU 1 is conducted to the thermo-siphon 6 via the heat pipe 3. The heat spreading board 5 includes the thick part 33 and the thin part 34. The thin part 34 contributes in reducing the weight of the heat spreading board 5.

8 Claims, 50 Drawing Sheets

THERMO-SIPHON AND MANUFACTURING METHOD OF THERMO-SIPHON AND INFORMATION PROCESSING APPARATUS

BACKGROUND OF THE INVENTION

1. Field of the Invention

The present invention relates to thermo-siphon and its manufacturing method and an information processing apparatus. Particularly, the present invention relates to the information processing apparatus for releasing heat generated at a heat generation unit to outside.

2. Background Art

Conventionally, a technique relating to this field is disclosed in Japanese unexamined patent publication HEI 9-6481. The conventional mobile information processing apparatus mentioned in this publication as illustrated in FIG. 55 comprises a lid 51 incorporating a heat pipe 3 and a heat spreading board 5, and a main body 50 incorporating a heat generation unit (central processing unit) 1. The heat generated from the heat generation unit 1 is released from the heat spreading board 5 via a thermally conductive block 2.

Another conventional techniques relating to this field are Japanese unexamined patent publications HEI 8-87354, HEI 8-204373 and HEI 8-261672.

FIG. 56 illustrates a side view of disintegrated lid 51.

Following components are installed in between a front panel 60 and an external chassis 12: a liquid crystal display panel 7; a back light 10; a back light optical system 62; and a inverter circuit board 95 for the back light.

FIG. 57 illustrates a temperature profile of the lid 51 and the main body 50.

In the drawing, curved lines in the temperature profile illustrate isotherms. As can be seen from FIG. 57, a lot of heat is being generated from the CPU 1, the back light 10 and the inverter circuit board 95.

FIG. 58 illustrate a conventional manufacturing method of thermo-siphon used in heat spreading.

FIG. 59 illustrate a manufacturing step of roll bond heat pipe disclosed in the explanatory note published by Showa Aluminum Kabushiki Kaisha.

The roll bond is manufactured as follows: cutting aluminum plates (S10); printing a path to form a flow channel on top of an aluminum plate by using a pressure adhesion preventing agent (S12); place another aluminum plate on top of the aluminum plate for rolling them together (S13, S14); and inflate the flow channel using high-pressure gas and the thermo-siphon is cut into a desired shape (S15, S16). The thermo-siphon is manufactured by injecting a working fluid to this inflated flow channel.

The conventional mobile information processing apparatus has difficulty in conducting heat, which is sent from the heat pipe 3, throughout the heat spreading board due to an inadequate heat conduction to a direction of plane of the heat spreading board 5. As a result of this, from within various positions of the heat spreading board 5, only positions that are close to the heat pipe 3 were able to contribute in spreading the heat such that an effect of heat spreading in the conventional mobile information processing apparatus is therefore inadequate.

The conventional thermo-siphon is manufactured by pressurizing the two aluminum plates together, however, since a specific gravity of aluminumplate is heavy, a weight of the thermo-siphon will also become heavy. This results in a problem of increasing the weight of information processing apparatus when attempt to spread the heat using the thermo-siphon.

Also, in the conventional mobile information processing apparatus, from the back light which is installed at inner lateral plane of the lid, a heat is transferred to the liquid crystal display panel to cause difference in temperature at a position close to the back light and at a position far from the back light. Due to such a temperature difference, a color inconsistency of the back light 10 occurs which is a problem.

SUMMARY OF THE INVENTION

The present invention attempts to solve this problem by aiming to reduce a weight of the thermo-siphon.

Also, at the same time as improving the heat generating efficiency of the information processing apparatus, the present invention aims to reduce a weight of the information processing apparatus.

Also, the present invention aims to control an effect due to the back light.

According to one aspect of the present invention, a thermo-siphon comprises: a heat spreading board; and a flow channel for circulating a working fluid. The heat spreading board includes a thick part and a thin part.

According to another aspect of the present invention, the heat spreading board of the thermo-siphon is arranged to place the thick part closer to the flow channel than the thin part.

According to another aspect of the present invention, the flow channel of the thermo-siphon forms a closed loop, and the thick part is formed at an inner periphery of the closed loop, and the thin part is formed at an inner side of the thick part.

According to another aspect of the present invention, the heat spreading board of the thermo-siphon is a combined plate of a first plate and a second plate, wherein the first plate is a flat board and the second plate has a lacking part.

According to another aspect of the present invention, the one of the plate of the plates from the first plate and the second plate of the thermo-siphon is larger than the other one of the plates, and a protruded edge of one of the plates is bent.

According to another aspect of the present invention, the first plate and the second plate of the thermo-siphon have different thickness.

According to another aspect of the present invention, the thermo-siphon is used in spreading heat of an electronic device.

According to another aspect of the present invention, the electronic device of the thermo-siphon comprises a main body having a heat generation unit, and a lid covering the main body, and wherein the thermo-siphon is installed on the lid.

According to another aspect of the present invention, a manufacturing method of the thermo-siphon comprises the following steps:

(a) cutting two plates for forming a heat spreading board;
(b) forming a lacking part on one of the plates;
(c) printing a flow channel using a pressure adhesion preventing agent on one of the plates;
(d) piling the two plates together;
(e) adhering the piled two plates by rolling;
(f) inflating the flow channel formed between the adhered plates; and
(g) injecting a working fluid in the flow channel.

According to another aspect of the present invention, the cutting step of the manufacturing method of thermo-siphon includes cutting of one plate larger in size than the other plate, and further the manufacturing method of thermo-siphon comprising a step of bending the protruded part of one of the plates after the adhering step.

According to another aspect of the present invention, an information processing apparatus comprises: a main body having the heat generation unit; and a lid where a liquid crystal display panel is installed at an inner plane. The information processing apparatus includes a heat spreading board exposed to and installed at an outer plane of the lid for releasing the heat generated at the heat generation unit to outside.

According to another aspect of the present invention, an exposed plane of the heat spreading board of the information processing apparatus is formed by a foaming paint layer.

According to another aspect of the present invention, a thermally conductive material for releasing the heat generated at the heat generation unit of the main body of the information processing apparatus is installed at a rear plane of the main body.

According to another aspect of the present invention, the foaming paint layer of the information processing apparatus is formed at the bottom plane of the main body.

According to another aspect of the present invention, the information processing apparatus comprises a frame that is easy to process compared to the heat spreading board, which is installed at periphery of the heat spreading board.

According to another aspect of the present invention, a coefficient of thermal expansion of the heat spreading board of the information processing apparatus is substantially identical to a coefficient of thermal expansion of the frame.

According to another aspect of the present invention, an additive used in the information processing apparatus is mixed into the heat spreading board for adjusting the coefficient of thermal expansion.

According to another aspect of the present invention, the foaming paint layer of the information processing apparatus includes a foaming layer which is foamed by painting a paint material including a foaming material, and a top coating layer having a high degree of hardness than the foaming layer on top of the foaming layer.

According to another aspect of the present invention, the top coating layer of the information processing apparatus is formed by a bead-containing paint material.

According to another aspect of the present invention, the paint material of the information processing apparatus is one of the paint material and a resinous coating material.

According to another aspect of the present invention, the thickness of the foaming layer of the information processing apparatus is ranging from 50 to 500 µm.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus do not limit the present invention, and wherein.

DETAILED DESCRIPTION OF THE PREFERRED EMBODIMENTS

Figure 1:
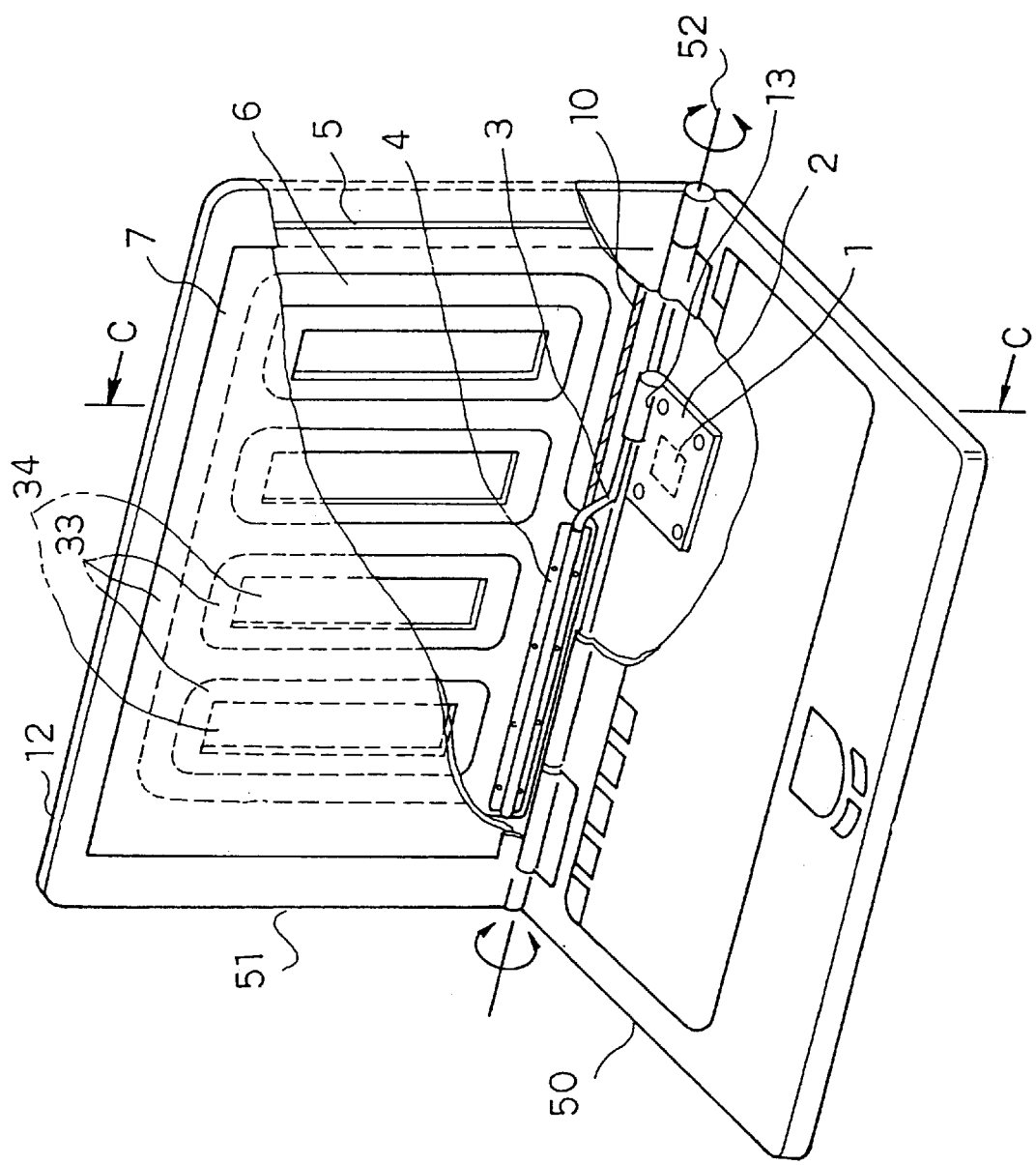
FIG. 1 is a side view illustrating one embodiment of the present invention.

Reference will now be made in detail to the present preferred embodiments of the invention, examples of which are illustrated in the accompanying drawings, wherein like reference numerals indicate like elements throughout the several views.

Embodiment 1.

Hereinbelow, a preferred embodiment of the thermo-siphon and the information processing apparatus of the present invention are described with reference to attached drawings.

Figure 2:
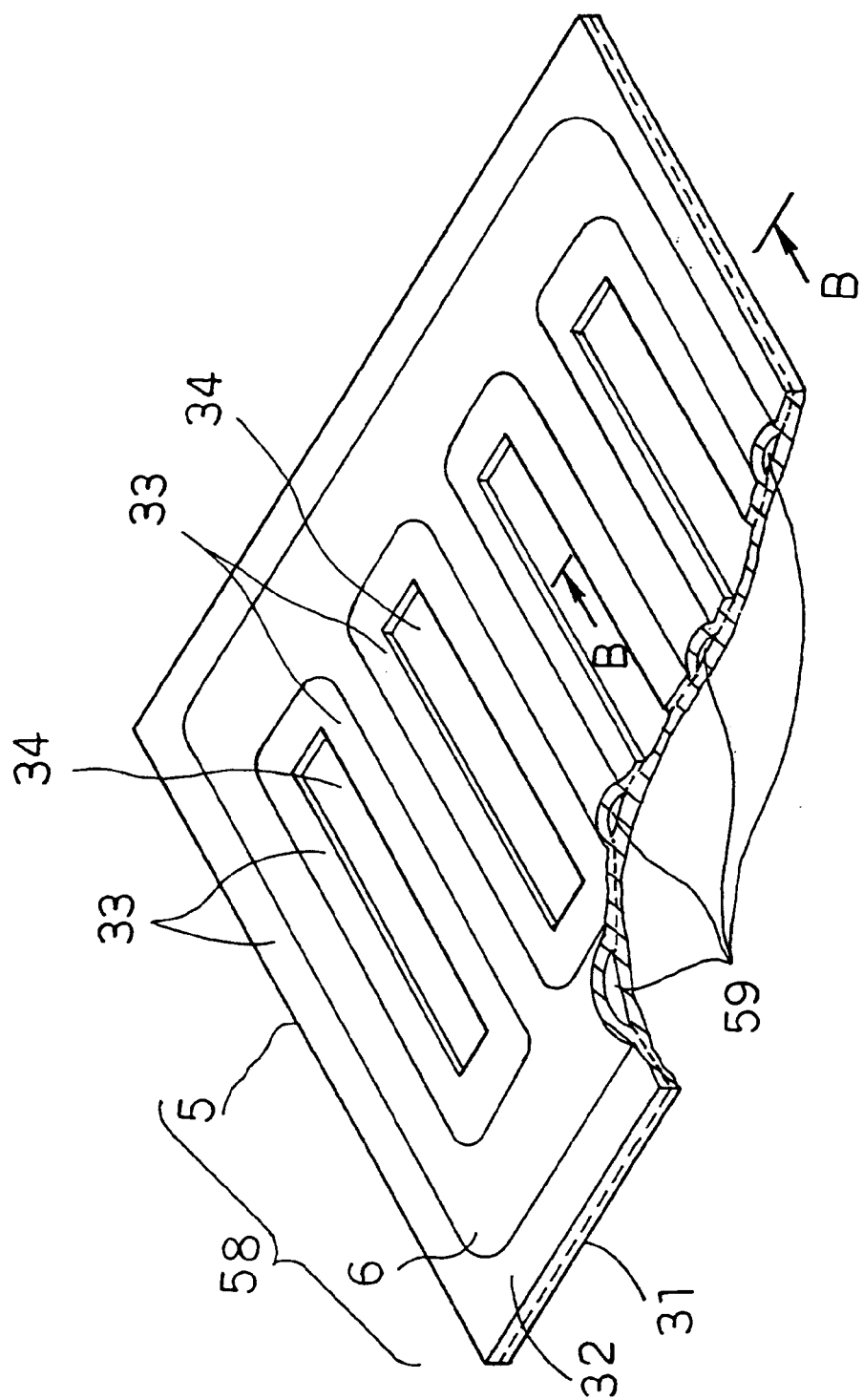
FIG. 2 is a partially disintegrated side view of thermo-siphon illustrating one embodiment of the present invention.
Figure 3:
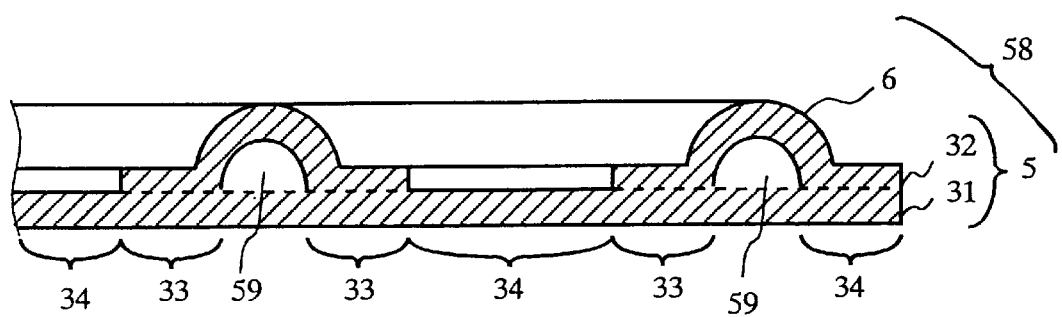
FIG. 3 is a cross-sectional diagram B—B of FIG. 2.

Configuration of the mobile information processing apparatus is described with reference to FIG. 1. Description of the numbered components follows: the main body 50 of a notebook type personal computer; the lid 51 for covering the main body 50; a connecting axis 52 having a hinge structure which connects the main body 50 and the lid 51; CPU (Central Processing Unit) 1 which is a heat generation unit; and the thermally conductive block 2 having a hinge 13 for efficiently collecting heat of CPU and conducting this heat to the heat pipe 3. The thermally conductive block 2 can be made of any material such as metal or carbon, as long as it is thermally conductive material. An axis of the hinge 13 of the thermally conductive block 2 is same as the connecting axis 52. The heat pipe encloses an adequate amount of liquid (hereinafter a working fluid) inside an exhausted metallic pipe for vaporizing at a fixed temperature. The heat pipe performs highly efficient heat transmission by taking a heat of vaporization at a high temperature side and dissipating heat of condensation at a low temperature side. Inside the heat pipe, the working fluid is circulated by a capillary force of wick having a gutter or a porous structure in a vertical direction installed at an inner wall of the pipe. A fastening board 4 for fastening the heat pipe 3 to the heat spreading board 5 can provide an effective thermal connection. A thermo-siphon 6 can perform highly efficient heat transmission under a same principal as the heat pipe 3. However, normally, gutter or porous structure in the vertical direction is not installed at an inner side of the thermo-siphon 6 such that the working fluid is not circulated using the capillary force of the wick. The working fluid inside the thermo-siphon 6 circulates along flow channel using gravity. An example of the thermo-siphon 6 is a roll bond panel 58 manufactured by Showa Aluminum Kabushiki Kaisha. As illustrated in FIG. 2, the roll bond panel 58 is formed by placing the two aluminum plates together, and has flow channel 59 that is hollow inside. An advantage of using the roll bond panel is an integral manufacturing of the heat spreading board 5 and the thermo-siphon 6. However, the heat spreading board 5 and the thermo-siphon 6 can be made independent of one another, as illustrated in FIG. 3. When a surface area of the thermo-siphon 6 is large, there is no need to install the heat spreading board 5. FIG. 1 further shows the following elements: the liquid crystal display panel 7, the back light 10; and the external chassis 12 of the lid 51.

FIG. 3 is the cross-section cut through B—B of FIG. 2.

In the drawing of FIG. 3, the heat spreading board 5 includes a first plate 31 and a second plate 32 that are rolled and adhered together. The first plate 31 and the second plate 32, for example, are Al (aluminum) plates having thickness of 0.4 mm. The first plate 31 is a flat board. The second plate 32 includes openings. The drawing illustrates one example of such lacking part. A thick part 33 on the heat spreading board is where the first plate 31 and the second plate 32 are overlapping, having thickness of 0.8 mm. A thin part 34 on the heat spreading board is where there is only the first plate 31, having thickness of 0.4 mm. The thickness of a portion where there is the flow channel 59 will be 1~2 mm.

The flow channel 59 forms a closed loop. The thick part 33 is formed at an outer periphery of the closed loop. The thin part 34 is formed at an inner side of the thick part 33.

The heat spreading method of the mobile information processing apparatus is described with reference to FIG. 4.

Figure 4:
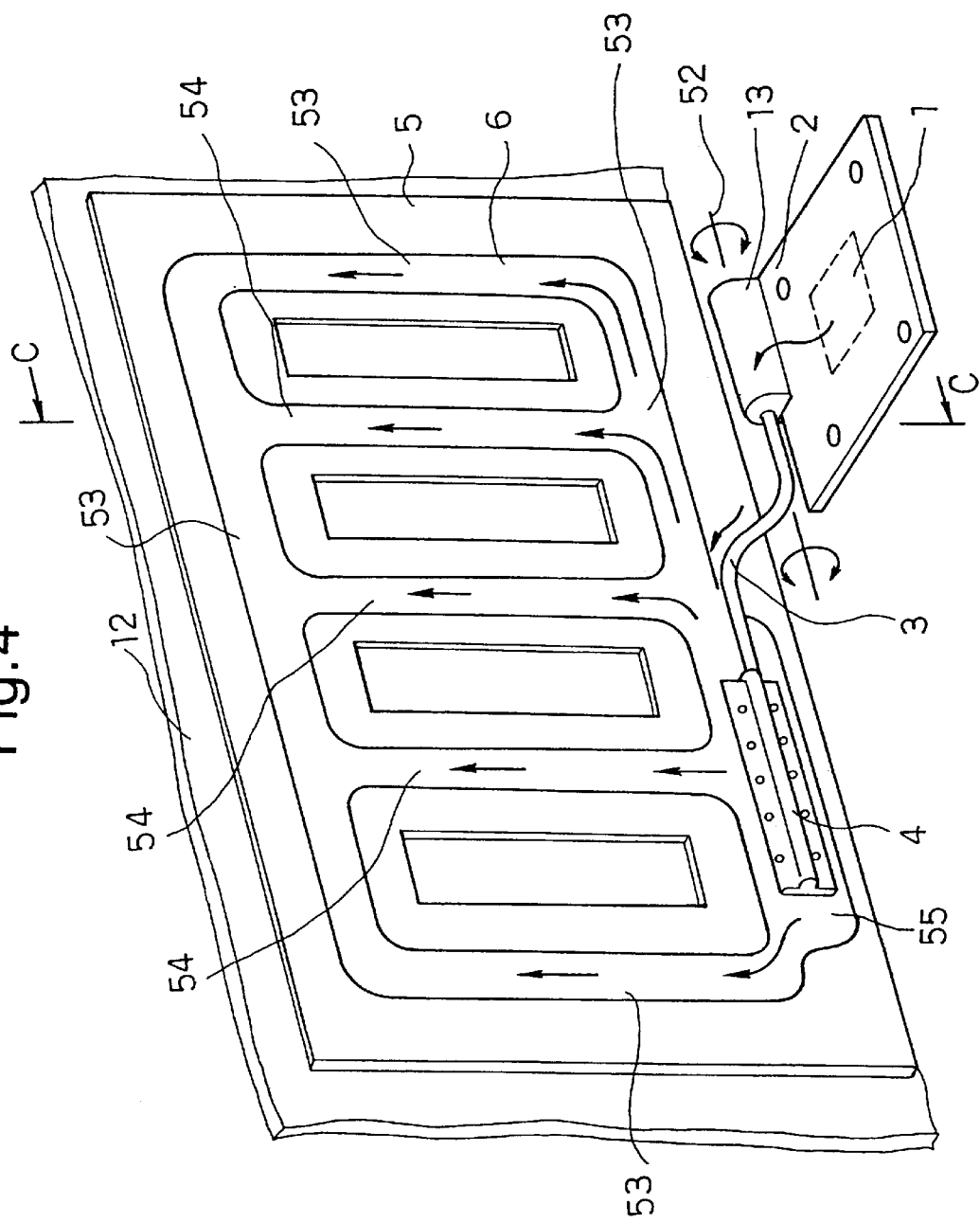
FIG. 4 is a side view illustrating one embodiment of the present invention.
Figure 5:
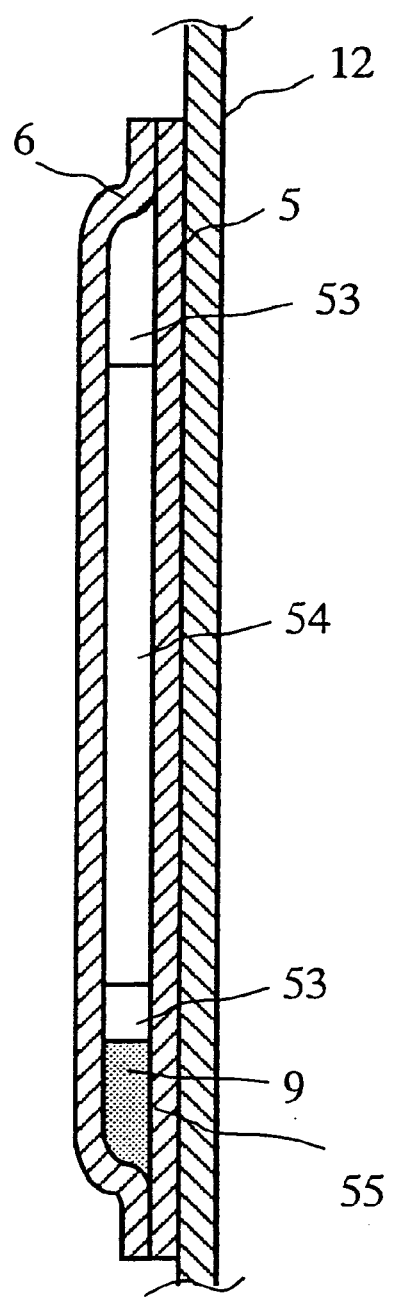
FIG. 5 is a cross-sectional diagram C—C of FIGS. 1 and 2.

FIG. 5 is a cross-section cut through C—C of FIG. 4.

The thermo-siphon 6 includes a liquid reservoir 55 for collecting the working fluid. The thermo-siphon 6 further includes vapor flow channels 53 and 54 for circulating the working fluid 9 in the direction of the plane of the heat spreading board 5. A case shown in FIG. 4 illustrates a first flow channel 53 for circulating around a periphery of the heat spreading board 5, and also illustrates second flow channels 54 for extending along to a perpendicular direction to the connecting axis 52, which joins to the first flow channel 53. The heat generated at the CPU 1 is conducted to the heat pipe 3 via the thermally conductive block 2, and is transferred to the heat spreading board by means of two-phase flow transfer. At the heat spreading board 5 where the thermo-siphon 6 is formed, the heat is dissipated efficiently by two-phase flow movement, and finally, the heat is dissipated to outer ambient by effects of convection and heat radiation.

Normally, liquid such as fluorinate or water is injected as the working fluid 9 to the liquid reservoir and the flow channels. After the injection, the liquid reservoir and the flow channels are decompressed and air-tightly sealed. The working fluid 9 will be collected at a lower part of the liquid reservoir due to an effect of the gravity, however, by making a high temperature heat source such as heat pipe attach to the lower liquid reservoir, the heat is conducted to the working fluid, which turns it into a vapor to cause an ascending vapor flow to a lower temperature part. When the heat is transferred accordingly, and the vapor flow is condensed to spread the heat inside the vapor flow channel. The working fluid is liquefied by the condensation and falls down the vapor flow channel under its own weight. That is, inside the thermo-siphon, the heat of vaporization is transferred by the circulation and the flow back of the working fluid under the effect of gravity. An effective heat transfer and the heat equalization occurs by heat transmission processes such as condensation and heat spreading. Comparing a use of the thermo-siphon to the heat conduction by using a metal only, one can expect a large improvement in a cooling capability.

Figure 6:
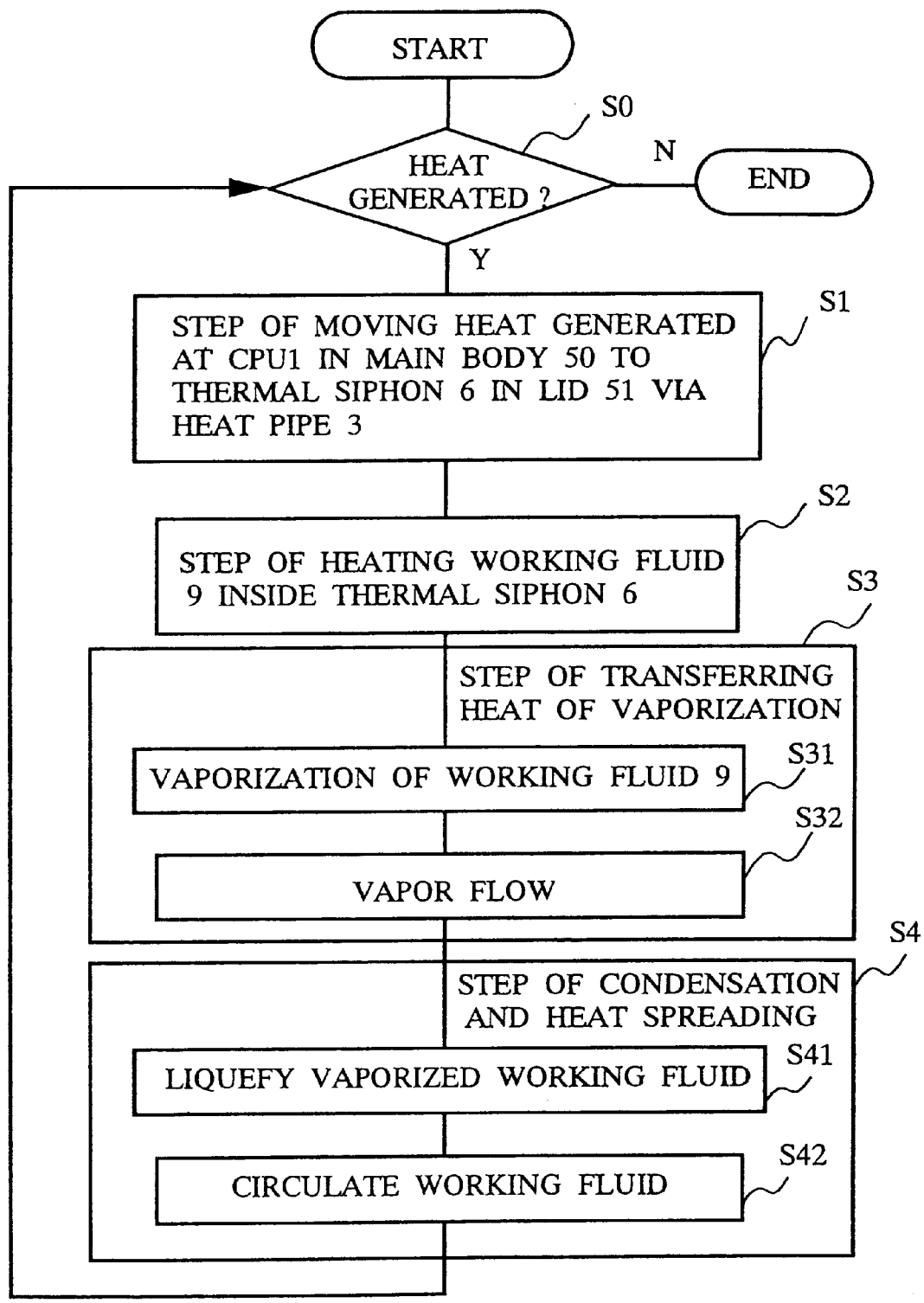
FIG. 6 is a flow chart of heat spreading method for one embodiment of the present invention.

FIG. 6 is a flow chart showing the heat spreading method.

In step S0, if the CPU 1 is not generating heat, the heat spreading process will not occur at all. If the CPU 1 which is installed on the main body 50 generates heat, in step S1, the heat from the CPU 1 is transferred to the thermo-siphon 6 via the heat pipe 3. Next, in step S2, the heat being transferred via the heat pipe 3 heats up the working fluid 9. Step S3 is a step to transfer the heat of vaporization. The step S3 includes a step of vaporizing the working fluid 9 (S31) and a step of circulating a vapor flow inside the vapor flow channel (S32). Next, step S4 is a step for spreading heat by the condensation of the vapor flow. The step S4 includes a step of liquefying the vaporized working fluid 9 (S41) and a step of returning the working fluid 9 through the vapor flow channel back into the liquid reservoir (S42). Accordingly, an operation from step S1 to S4 is repeated as long as the heat continues to be generated.

The thermo-siphon 6 has a thickness of 1~2 mm, therefore, this is made much thinner than a case of installing a fan. Also, the fan will not be needed even for CPU which desires a use of the fan, and the thermo-siphon 6 can bring about a greater heat spreading effect over the fan.

Figure 8:
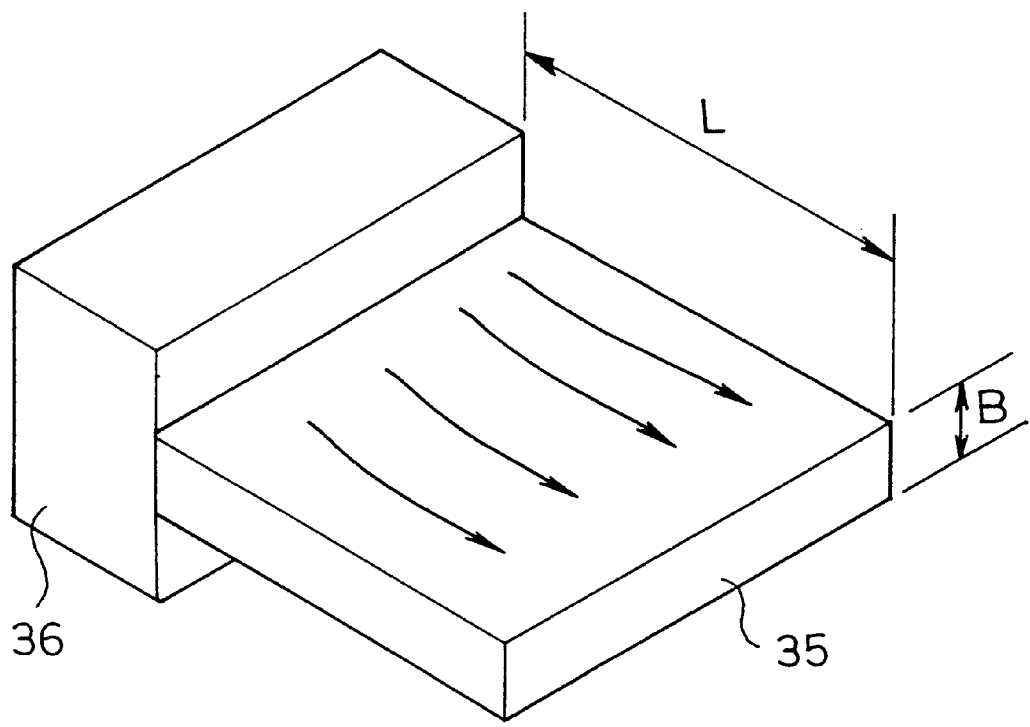
FIG. 8 illustrates the heat spreading efficiency.

FIG. 8 illustrates a heat spreading fin 35 having a length L and a thickness B, which is attached to a heat generation unit 36.

Figure 7:
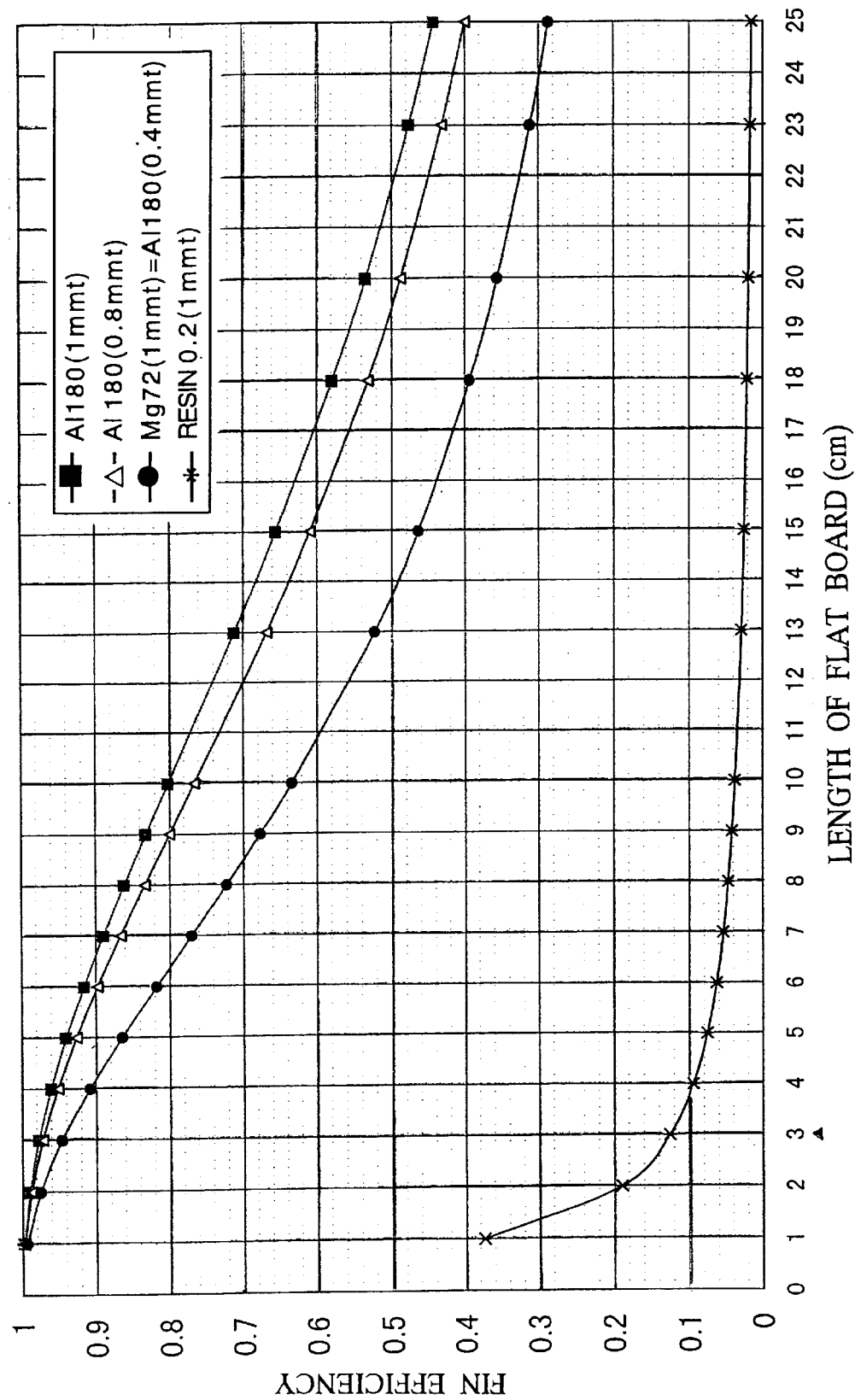
FIG. 7 is a graph showing relationship of heat spreading fin and fin efficiency.

FIG. 7 is a graph showing fin efficiency upon changing the length L.

In the graph of FIG. 7, a black square "■" indicates the fin efficiency of Al plate having thickness B=1 mm. Also, in the graph, a white triangle "Δ" indicates the fin efficiency of Al plate having thickness of B=0.8 mm. Also, a black circle "●" in the graph indicates the fin efficiency of Al plate having thickness B=1 mm or B=0.4 mm. Also, an asterisk "*" in the graph indicates the fin efficiency of Al plate having thickness B=1 mm. The fin efficiency is the ratio of an actual amount of heat spreading from the whole conducting plane of the fin and an amount of heat spreading assuming that the whole conducting plane of the fin is equivalent to temperature of the heat generation unit. When the fin efficiency is 1 (100%), it is a case when the effect of heat spreading is maximum. As can be understood from FIG. 7, the longer the length L where the heat is conducted, the fin efficiency is poor. In order to maintain a sufficient heat spreading efficiency, the fin efficiency must ideally be greater than 0.8. Accordingly, when using Al plate having thickness B=0.8 mm as the heat spreading board, to make the fin efficiency greater than 0.8, the length L of the heat spreading board must be below 9 cm. Also, when using aluminum plate having a thickness B=0.4 mm as heat spreading board, the length L should be below 6 cm.

Figure 9:
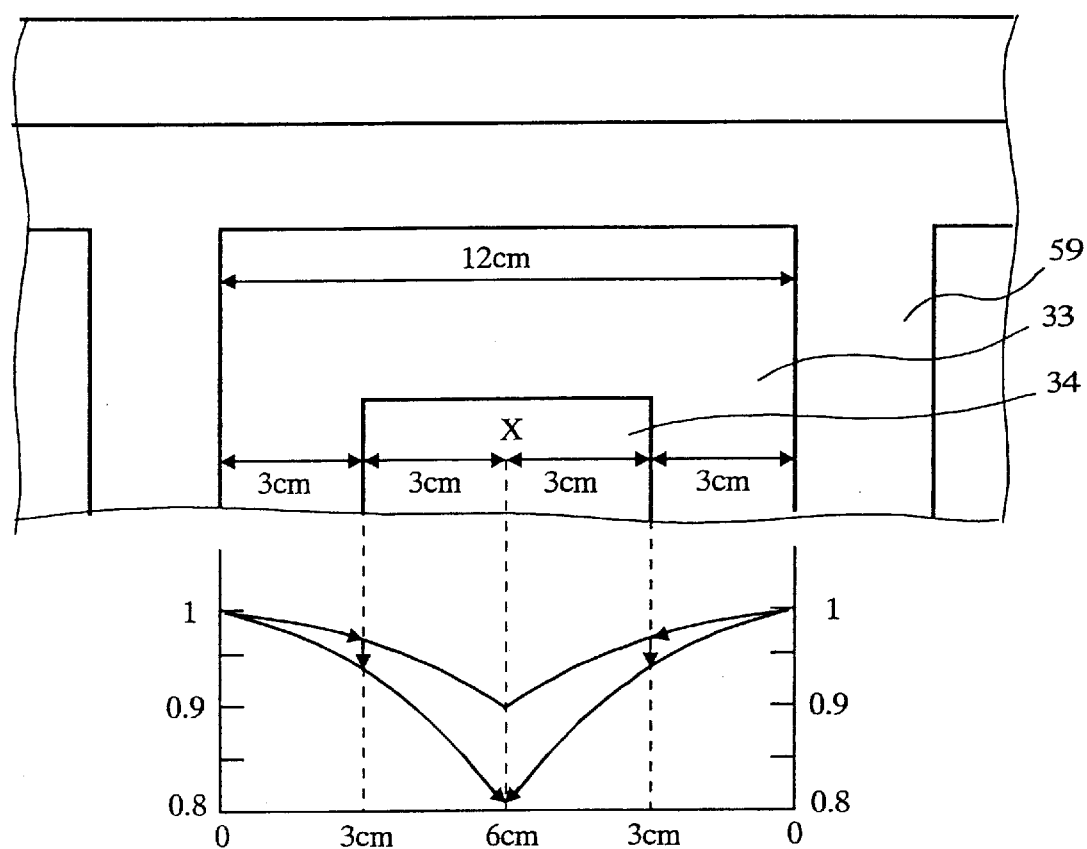
FIG. 9 illustrates a fin efficiency of one embodiment of the present invention.

FIG. 9 illustrates a thermo-siphon for which a distance between the flow channel 59 is 12 cm.

The flow channel 59 forms a closed loop. The thick part 33 is formed at an outer periphery of the closed loop. The thin part 34 is formed at an inner side of the thick part 33.

Provided that a length of the thick part 33 is 3 cm, then a length of the thin part 34 will be 6 cm. A central part X of the thin part 34 is located at 6 cm from an edge of the flow channel 59. The thermo-siphon is formed using the aluminum plates. If a thickness of the thick part 33 is 0.8 mm and a thickness of the thin part 34 is 0.4 mm, the fin efficiency is indicated by arrow illustrated at a lower part of FIG. 9. That is, the thick part 33 having the thickness 0.8 mm shows the fin efficiency as in FIG. 7, and the thin part 34 having the thickness 0.4 mm shows the fin efficiency as in FIG. 7. If the central part X of the thin part 34 is separated by greater than 6 cm from its most closest flow channel 59, then there is a possibility of the fin efficiency to be greater than 0.8, such that a desirable heat spreading effect cannot be expected.

Figure 10:
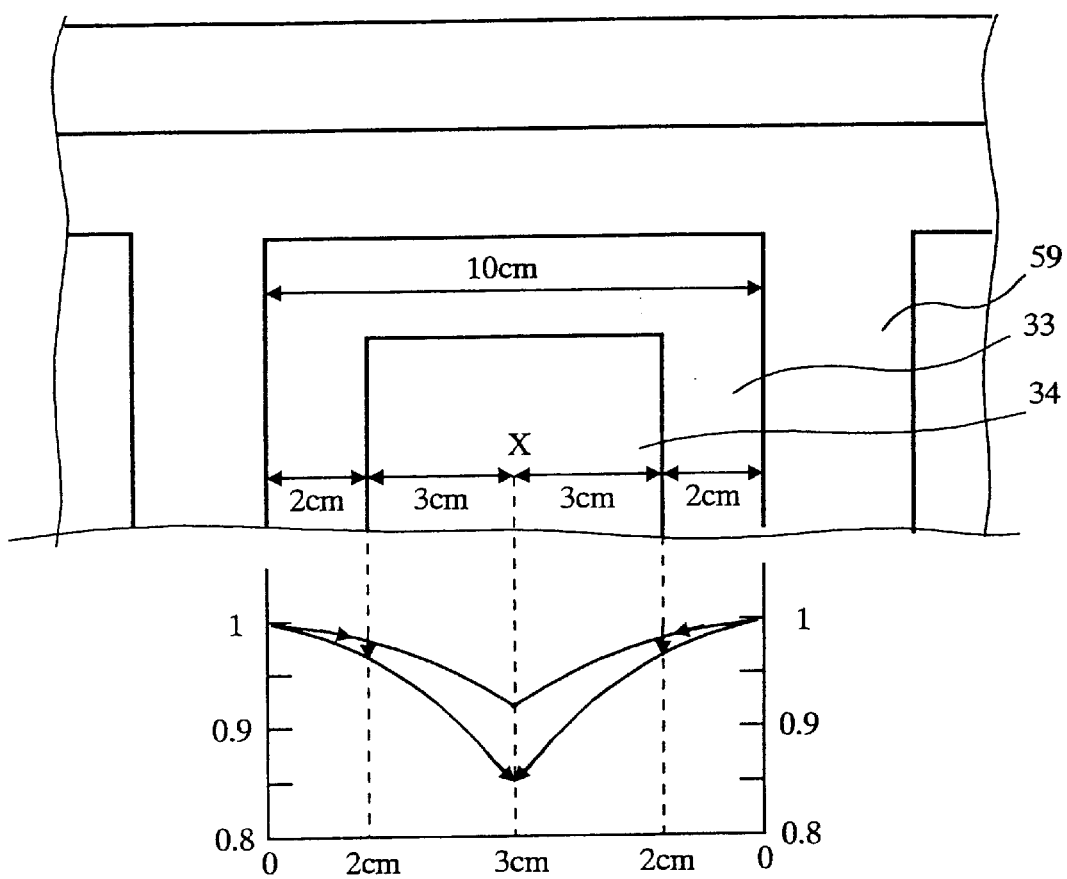
FIG. 10 illustrates a fin efficiency of one embodiment of the present invention.

FIG. 10 illustrates a thermo-siphon for which the distance between the flow channel 59 is 10 cm.

The central part X is located at 5 cm away from the flow channel 59. Accordingly, at the central part X where the fin efficiency is minimum, the fin efficiency is 0.85, therefore, the fin efficiency of the central part X illustrated in FIG. 9 will be a value higher than 0.8.

As such, by thinning the thickness of the heat spreading board, the fin efficiency declines, however, by shortening the distance from the flow channel 59, a pattern of the thick part 33 and the thin part 34 can be designed as to maintain the fin efficiency at least greater than 0.7 (70%) or preferably to be greater than 0.8 or 0.9.

As described previously, the disadvantage of installing the thin part 34 to the heat spreading board 5 is in the decline in the effect of heat spreading. However, an advantage of this is that this can reduce a weight of the heat spreading board 5. Particularly, for the mobile information processing apparatus, its weight is required to be reduced as much as possible. The heat spreading board 5 of the present embodiment installs the thin part 34 to reduce its weight. For example, provided that a size, a thickness, and a material forming the first plate and the second plate are identical, if 30% of the openings (lacking parts) are installed on the second plate 32, and given that the weight of the first plate and the second plate is 100, the weight of heat spreading board formed will be (100+70)/(100+100)=0.85, which means it is 85% of the weight of not installing the openings. Alternatively, when installing 50% of openings, the weight of heat spreading board 5 will be (100+50)/(100+100)=0.75, and comparing this to the case of not installing the openings, the weight is 75%.

Figure 11:
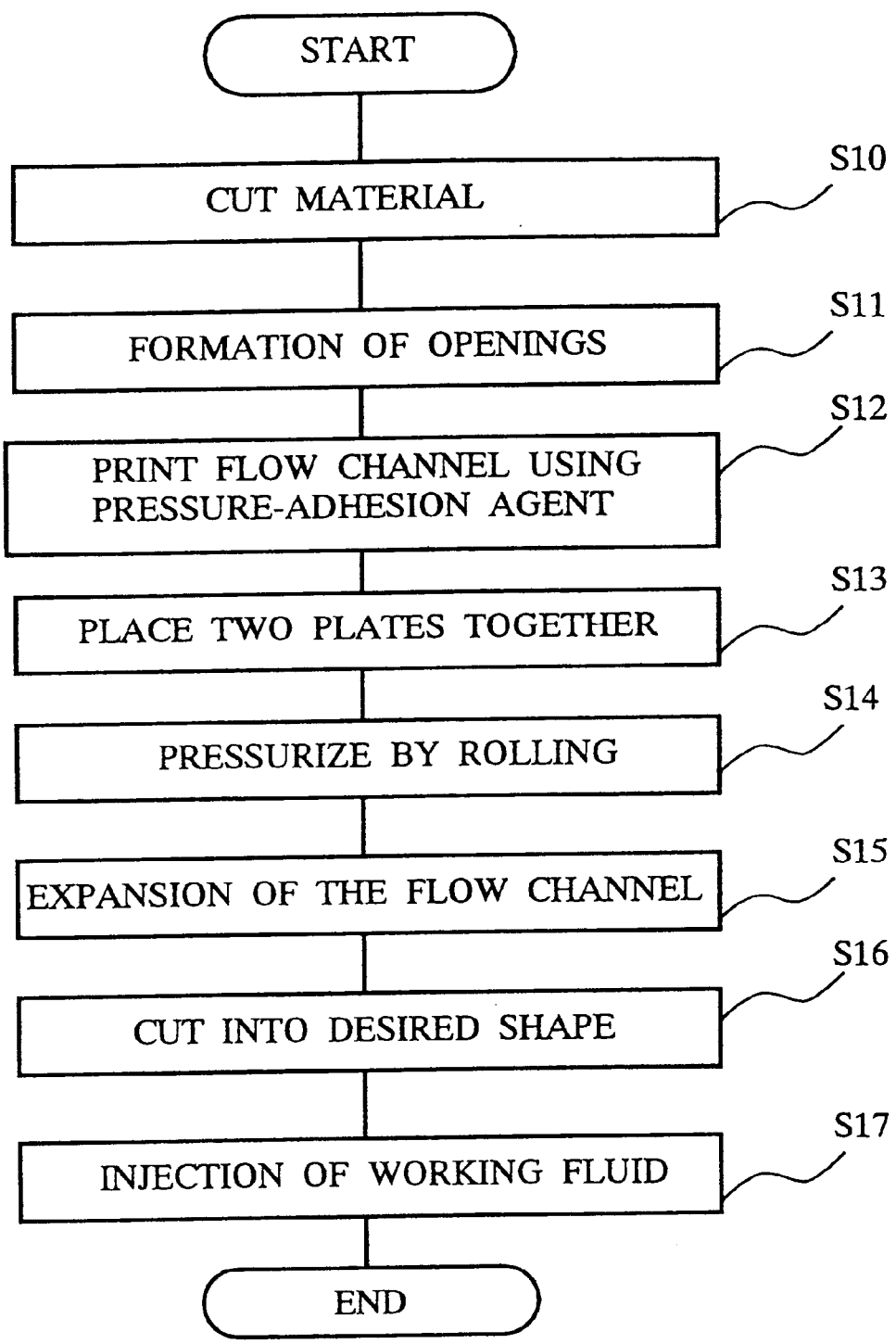
FIG. 11 illustrates a flow chart of manufacturing method of thermo-siphon illustrating one embodiment of the present invention.
Figure 12:
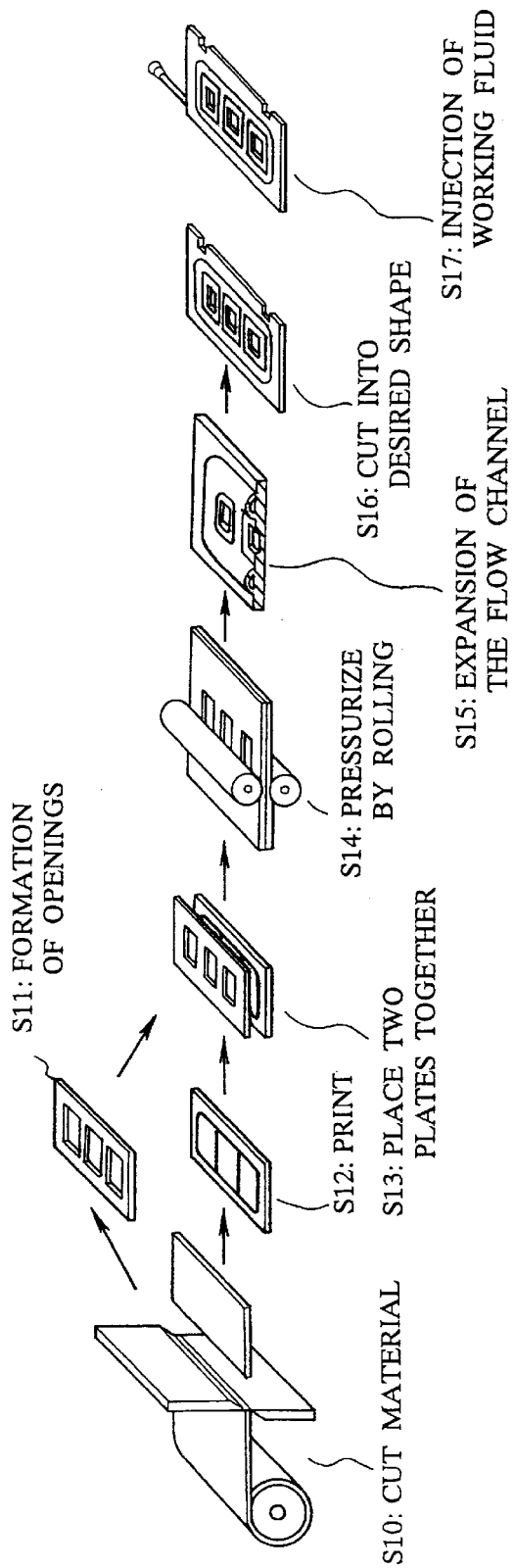
FIG. 12 illustrates a flow chart of manufacturing method of thermo-siphon illustrating one embodiment of the present invention.

FIGS. 11 and 12 illustrate manufacturing method of the thermo-siphon for the present embodiment.

First of all in step S10, cut the two aluminum plates. This will be used to form the thermo-siphon. Next in step S11, the openings are formed on one of the aluminum plates by a punch processing. Next in step S12, the flow channel pattern is printed to the other one of the aluminum plates by using the pressure adhesion preventing agent. This printing can be done on the plate where the openings are being formed. Next in step S13, two plates are placed together. Next in step S14, the two plates are adhered together by rolling. Next in step S15, high-pressure gas is blown into the flow channel of the pressurized plate to cause inflation of the flow channel. Next in step S16, the adhered plates is cut into a desired shape. Next, in step S17, working fluid is injected into the inflated flow channel and a mouth where the working fluid is injected is sealed. The thermo-siphon is manufactured this way.

FIGS. 13 to 17 illustrate various opening patterns installed on the second plate 32.

Figure 13:
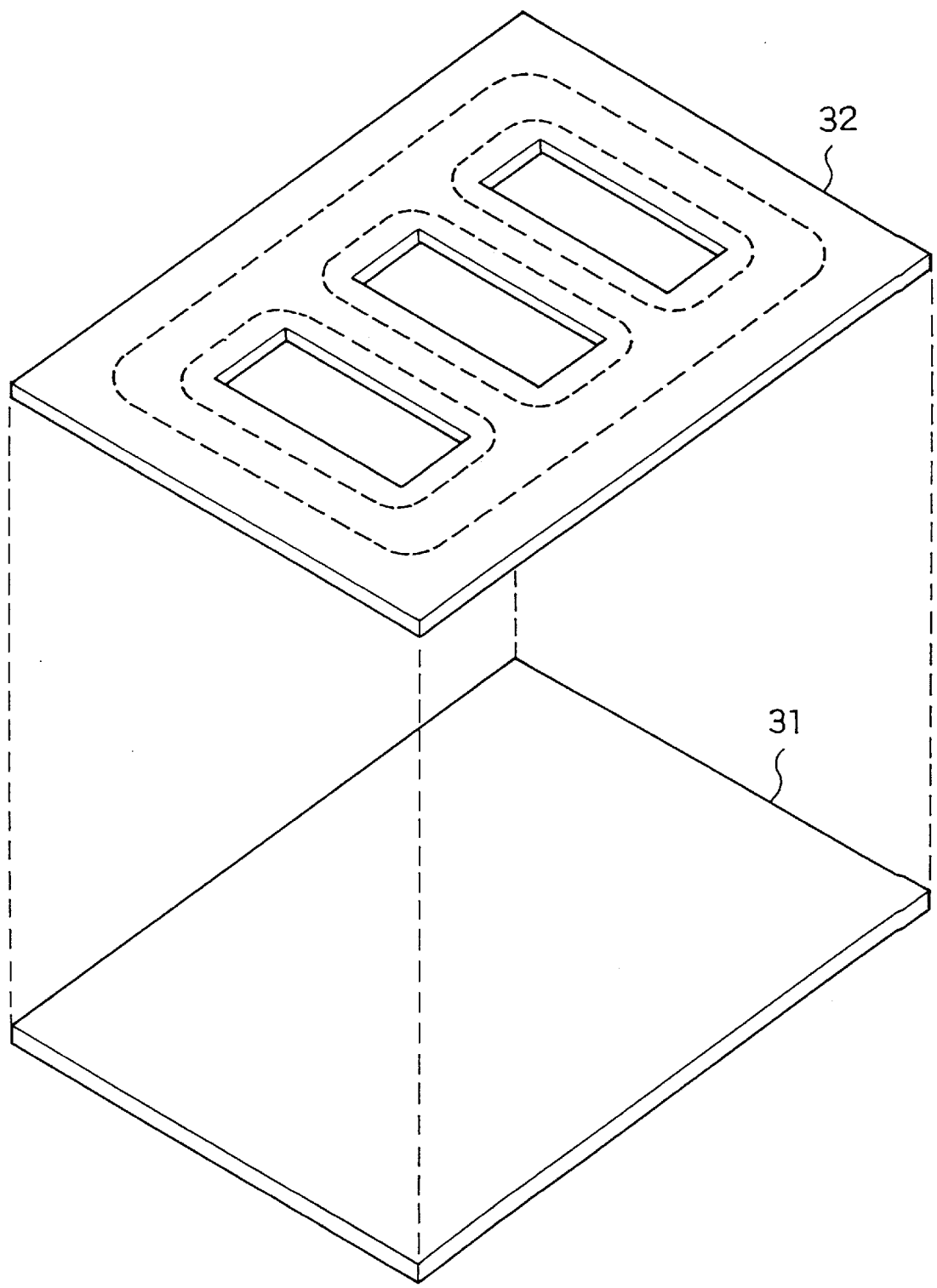
FIG. 13 illustrates one example of a first plate 31 and a second plate 32 of the present invention.

FIG. 13 illustrates a case of installing one opening at inner side of a closed flow channel loop.

Figure 14:
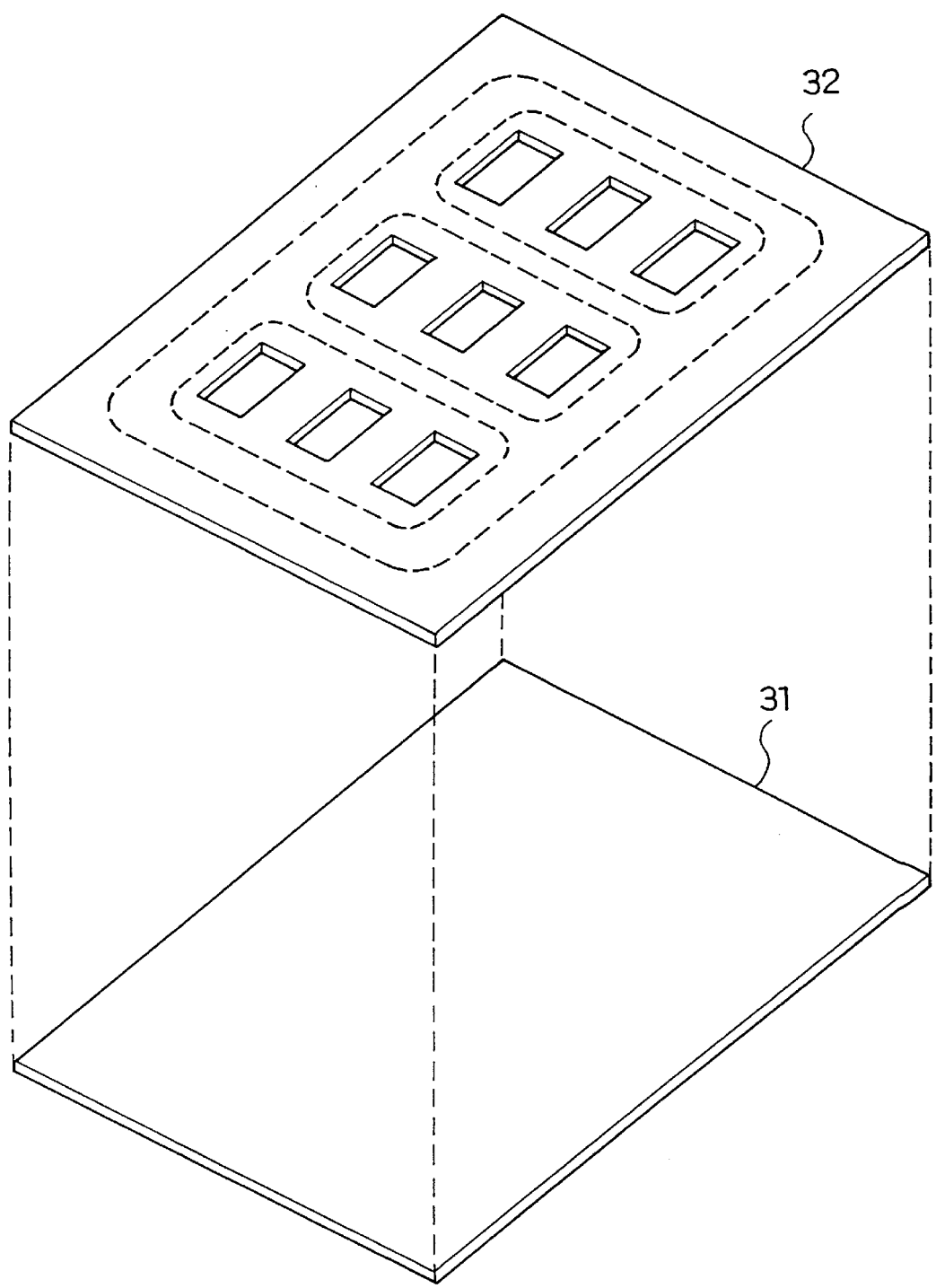
FIG. 14 illustrates another example of a first plate 31 and a second plate 32 of the present invention.

FIG. 14 illustrates a case of installing a plurality of openings at inner side of the closed flow channel loop.

When installing a large opening as the case illustrated in FIG. 13, a strength of the second plate 32 is reduced, as a result, the strength of the thermo-siphon is also reduced. For the case illustrated in FIG. 14, in which a plurality of openings are installed by making them smaller, a decline in the strength is reduced as much as possible.

Figure 15:
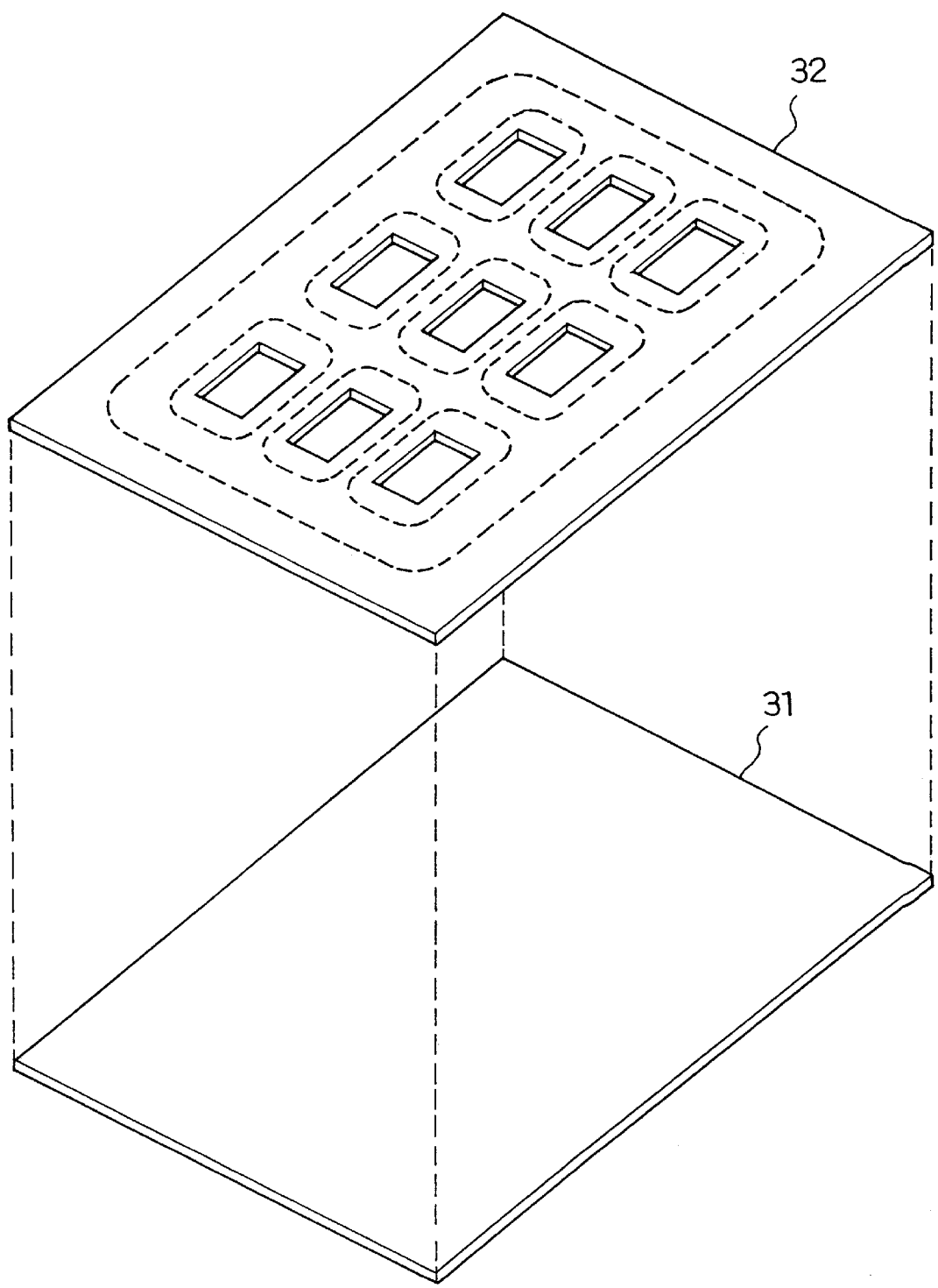
FIG. 15 illustrates another example of a first plate 31 and a second plate 32 of the present invention.

FIG. 15 illustrates a case of installing flow channels to all the openings.

Figure 16:
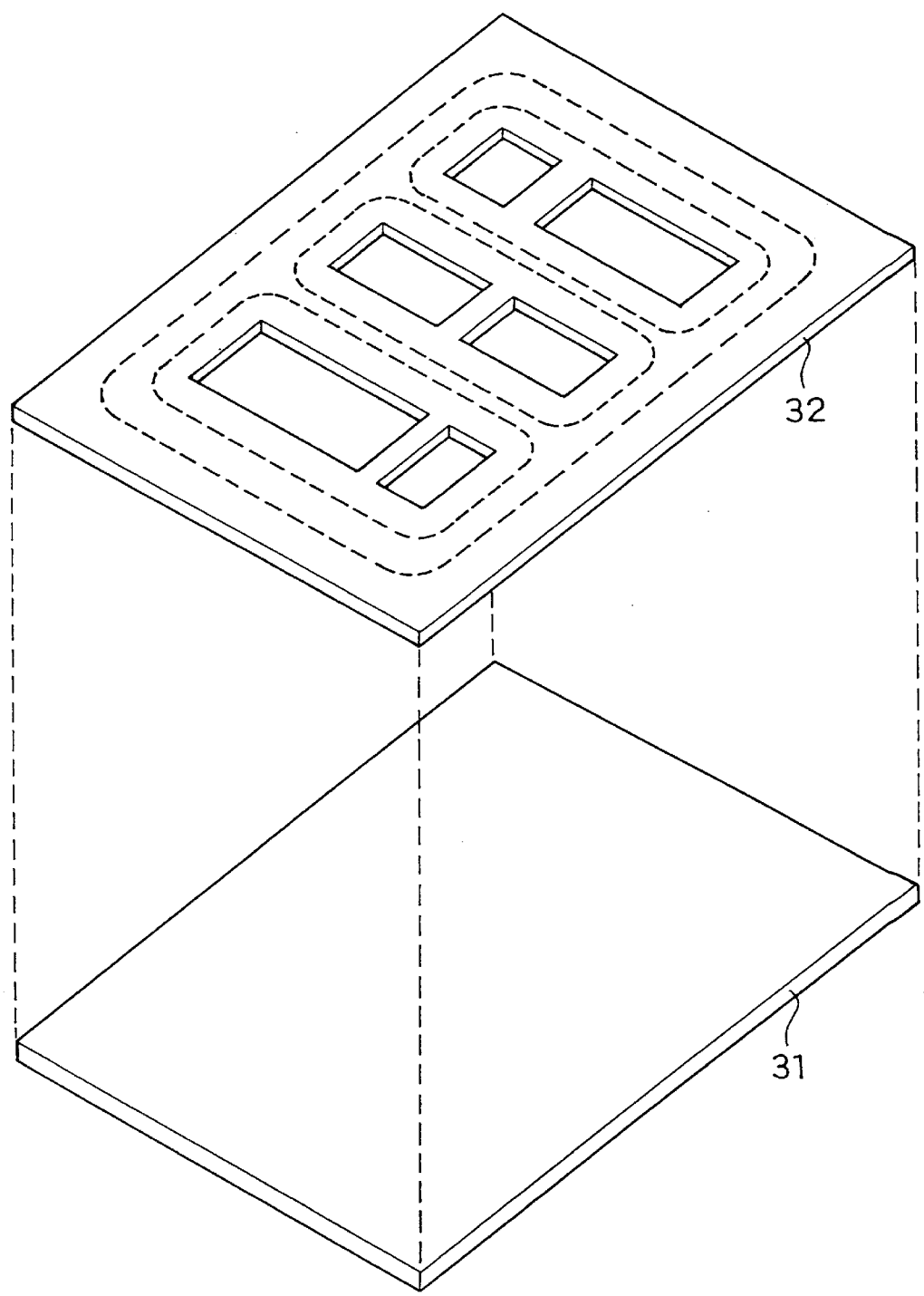
FIG. 16 illustrates another example of a first plate 31 and a second plate 32 of the present invention.

FIG. 16 illustrates a case of spreading a weakness point in the first plate 31 by changing the opening pattern.

Figure 17:
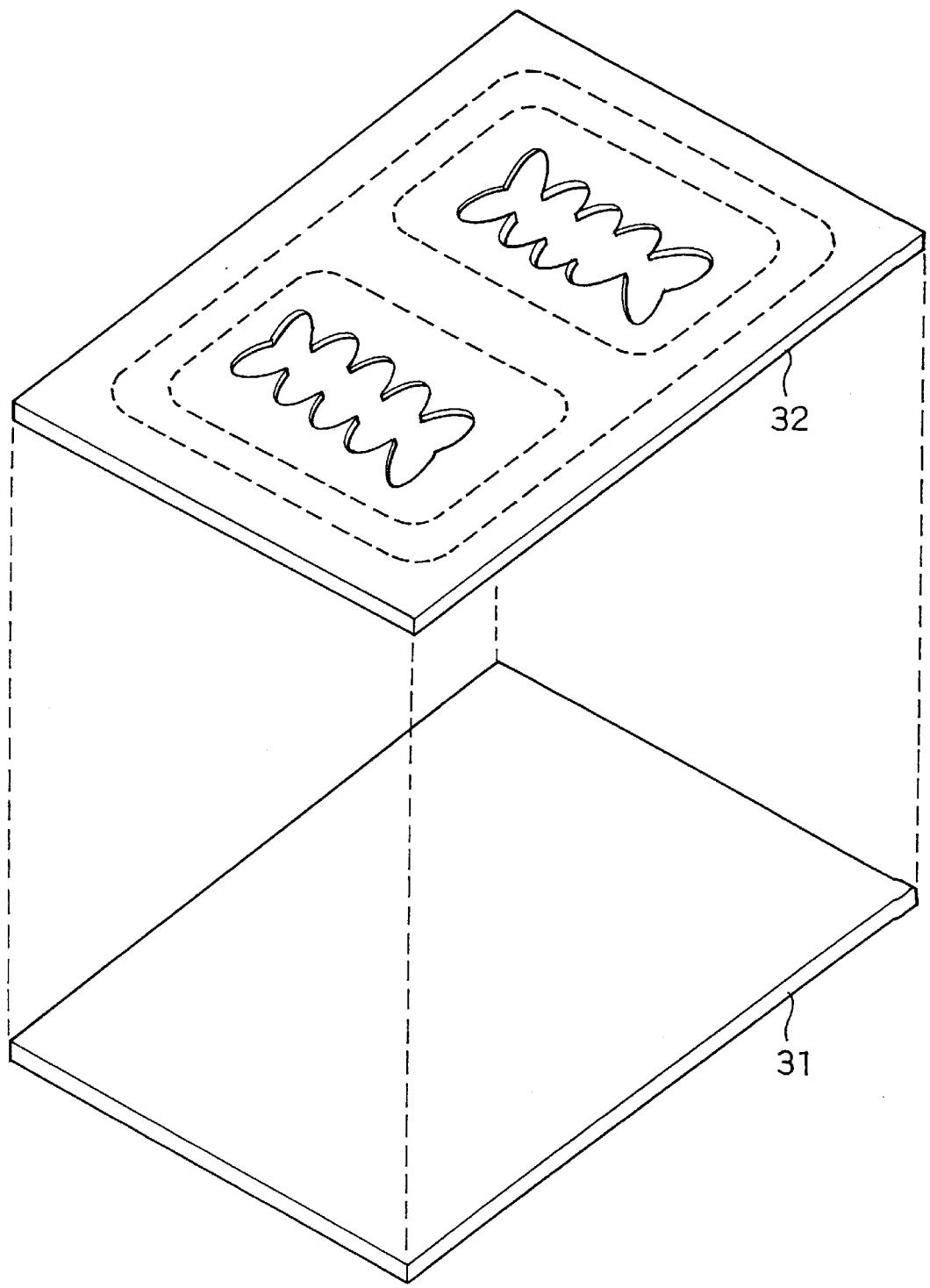
FIG. 17 illustrates another example of a first plate 31 and a second plate 32 of the present invention.

FIG. 17 illustrates a case of making the shape of the opening a sawtooth shape. Other shapes of the opening can be adopted to the opening patterns of FIGS. 13 to 17.

Figure 18:
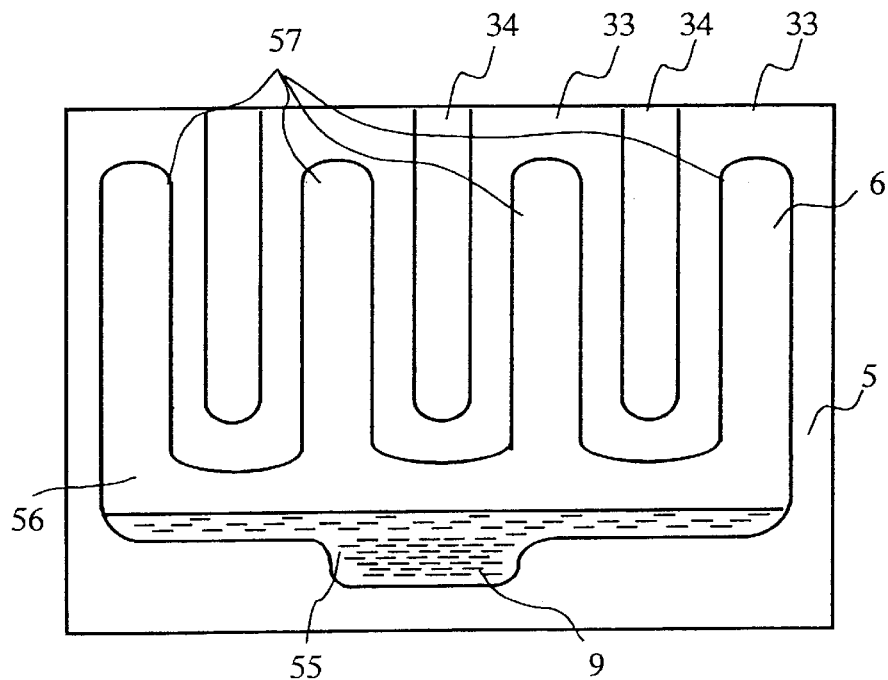
FIG. 18 illustrates a thermo-siphon of one embodiment of the present invention.
Figure 19:
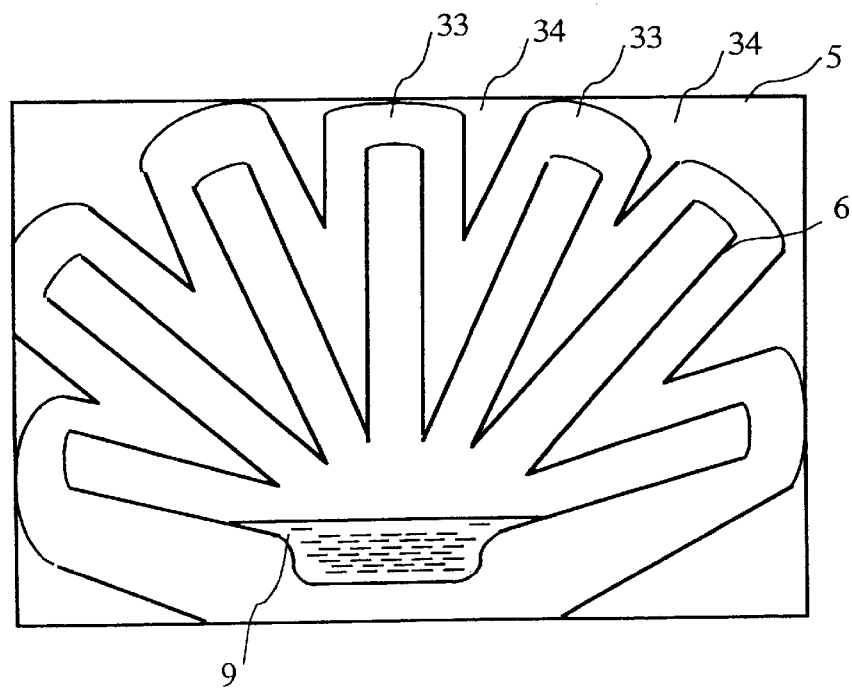
FIG. 19 illustrates a thermo-siphon of one embodiment of the present invention.

Besides the lacking part of the thermo-siphon being the openings, FIGS. 18 and 19 illustrate cases of cutting the lacking part.

FIG. 18 illustrates a case of thermo-siphon being formed by installing a comb-shaped cut-out on the second plate 32.

FIG. 19 illustrate a case of thermo-siphon being formed by installing a hand-shaped cut-out on the second plate 32.

Figure 20:
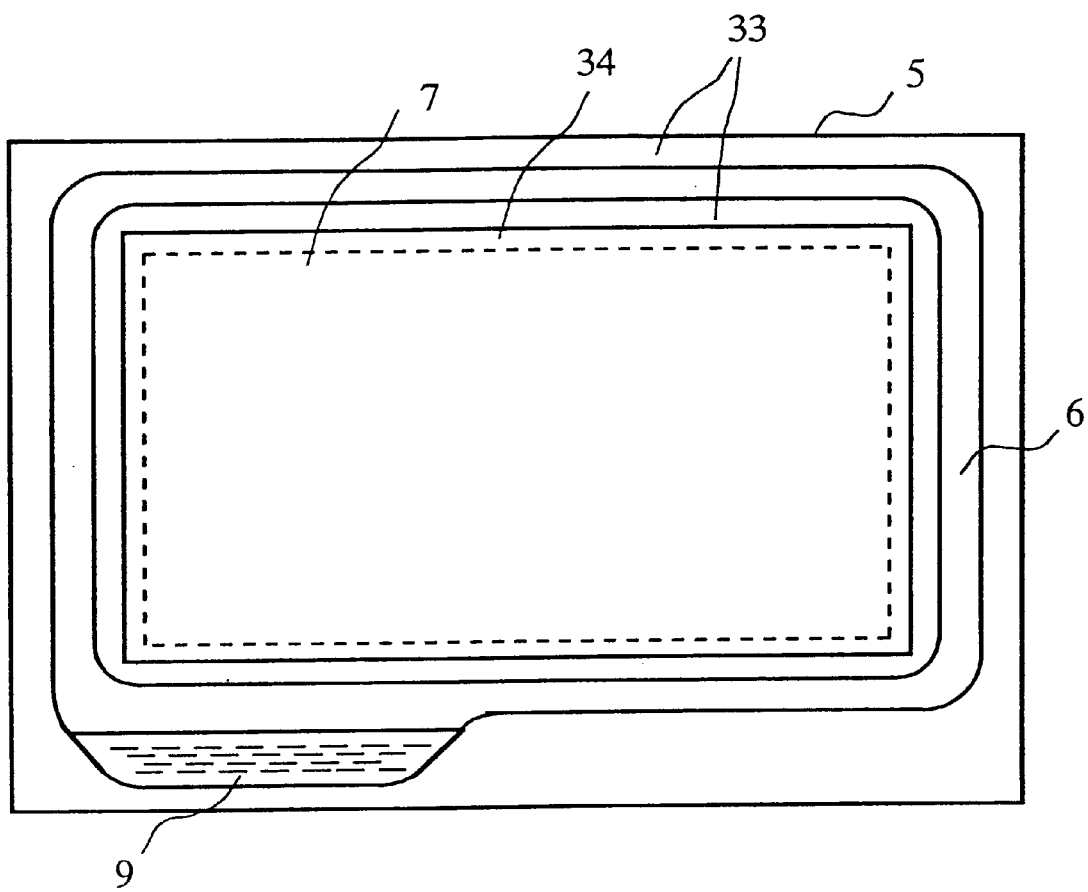
FIG. 20 illustrates a thermo-siphon of one embodiment of the present invention.

FIG. 20 illustrate a case of thermo-siphon being formed by installing one large opening at a central part.

Due to this large opening, the thin part 34 is formed at a center, however, the size of the thin part 34 is either the same size as the size of liquid display panel 7 or greater. In order to make a thickness of the lid 51 thin, it is desirable to make the thickness of the thermo-siphon thin as much as possible especially where there is the liquid crystal display panel 7. Accordingly, the thin part 34, which is the thinnest part of the thermo-siphon, is placed behind the liquid crystal display panel 7, and the thick part 33 and the flow channel 59 are placed to a part where there is no liquid crystal display panel 7 to reduce the thickness of the lid 51.

Figure 21:
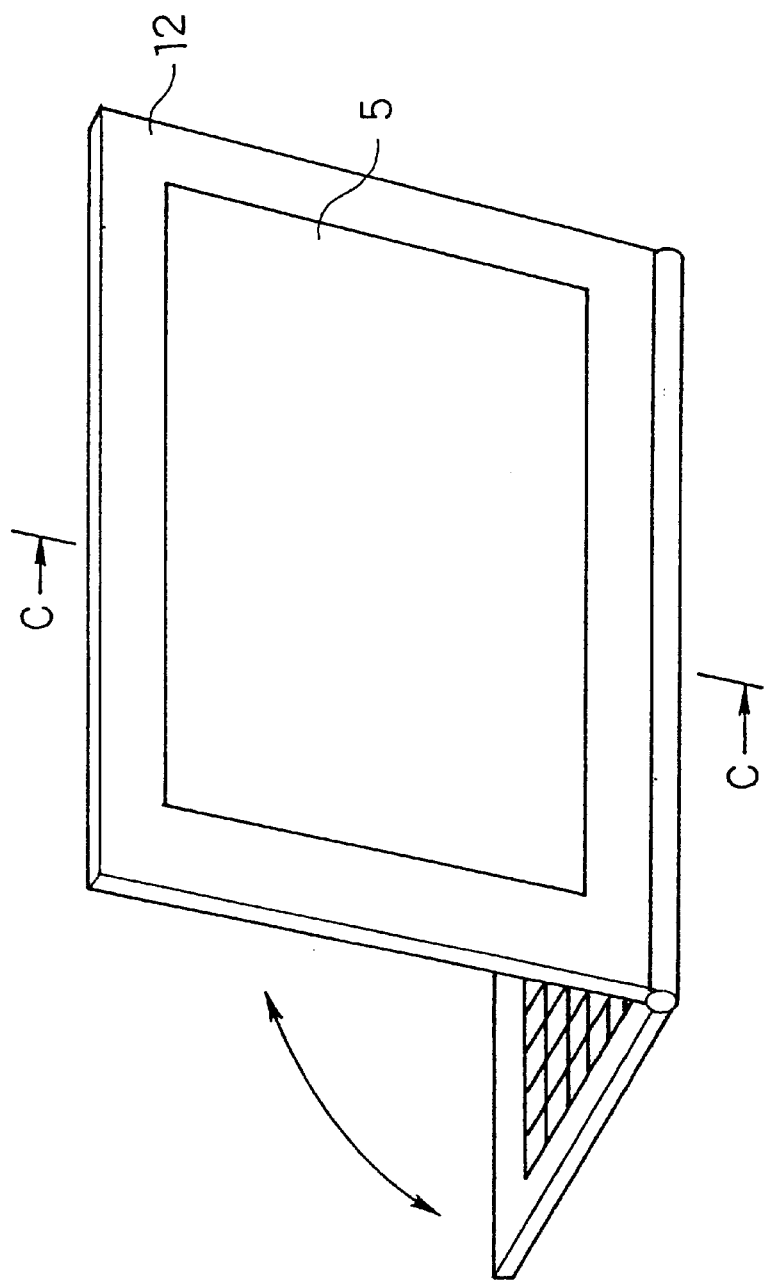
FIG. 21 illustrates a side view of lid illustrating one embodiment of the present invention.

FIG. 21 illustrates the side view of the lid 51 from the outer side.

Figure 22:
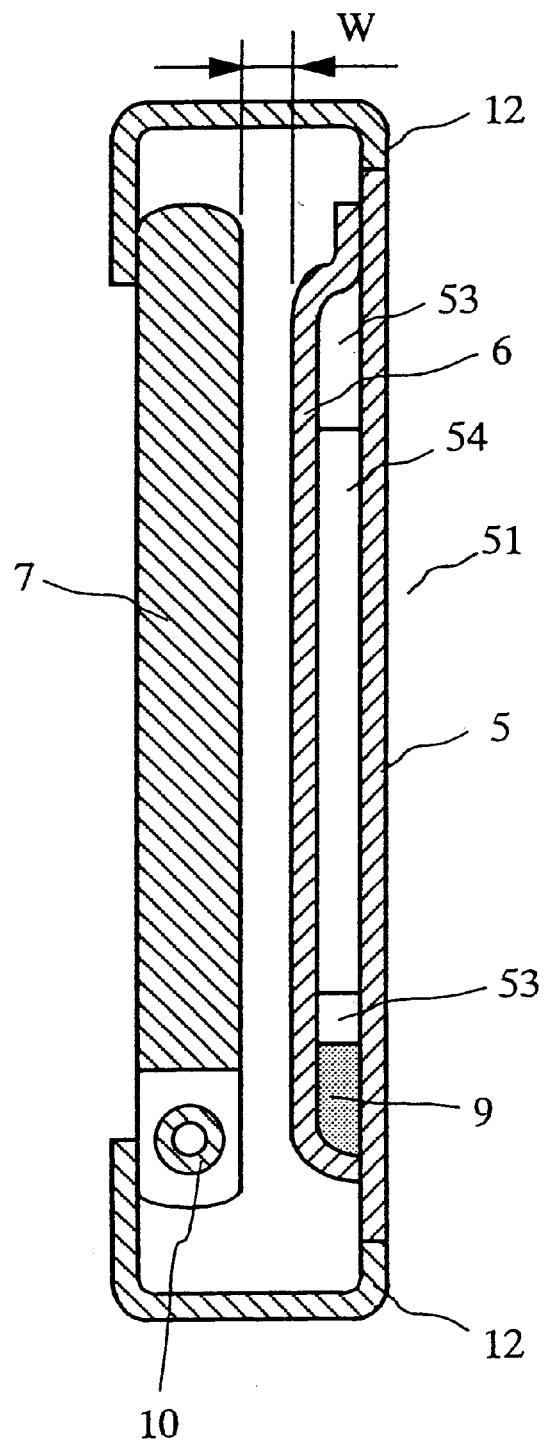
FIG. 22 is a cross-sectional view illustrating one embodiment of the present invention.

FIG. 22 illustrates the cross-section cut through C—C of FIG. 21.

In the drawing of FIG. 21, a chassis 12 is forming the outer cover of the lid 51. The heat spreading board 5 is partially exposed to outer chassis 12 of the lid 51.

As illustrated in FIGS. 4 and 5, the previously described thermo-siphon is used inside the chassis 12. However, as illustrated in FIGS. 21 and 22, the heat spreading board 5 itself is exposed as a part of the chassis, which enables further improvement in the heat spreading efficiency.

Figure 23:
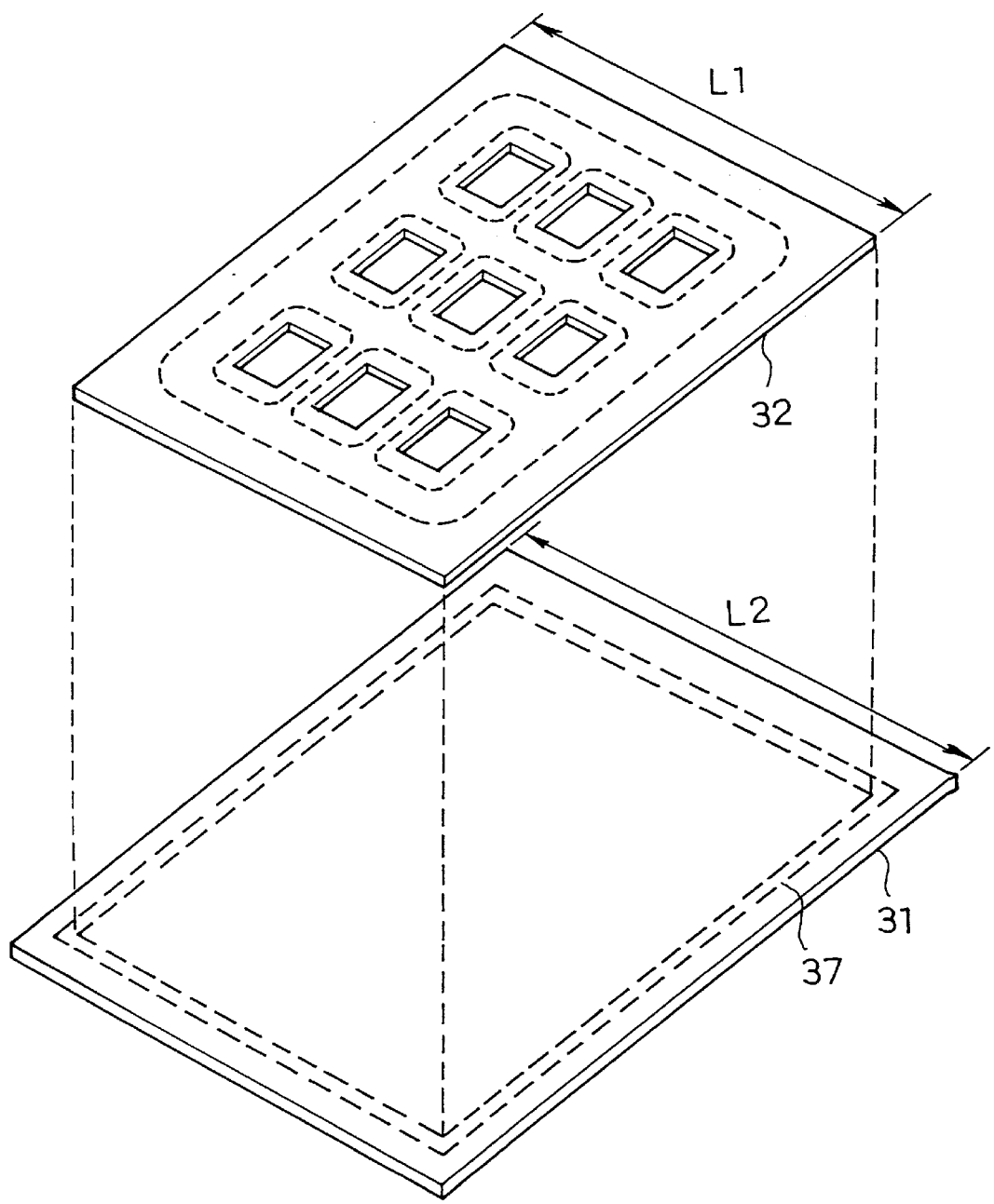
FIG. 23 illustrates another example of a first plate 31 and a second plate 32 of the present invention.
Figure 24:
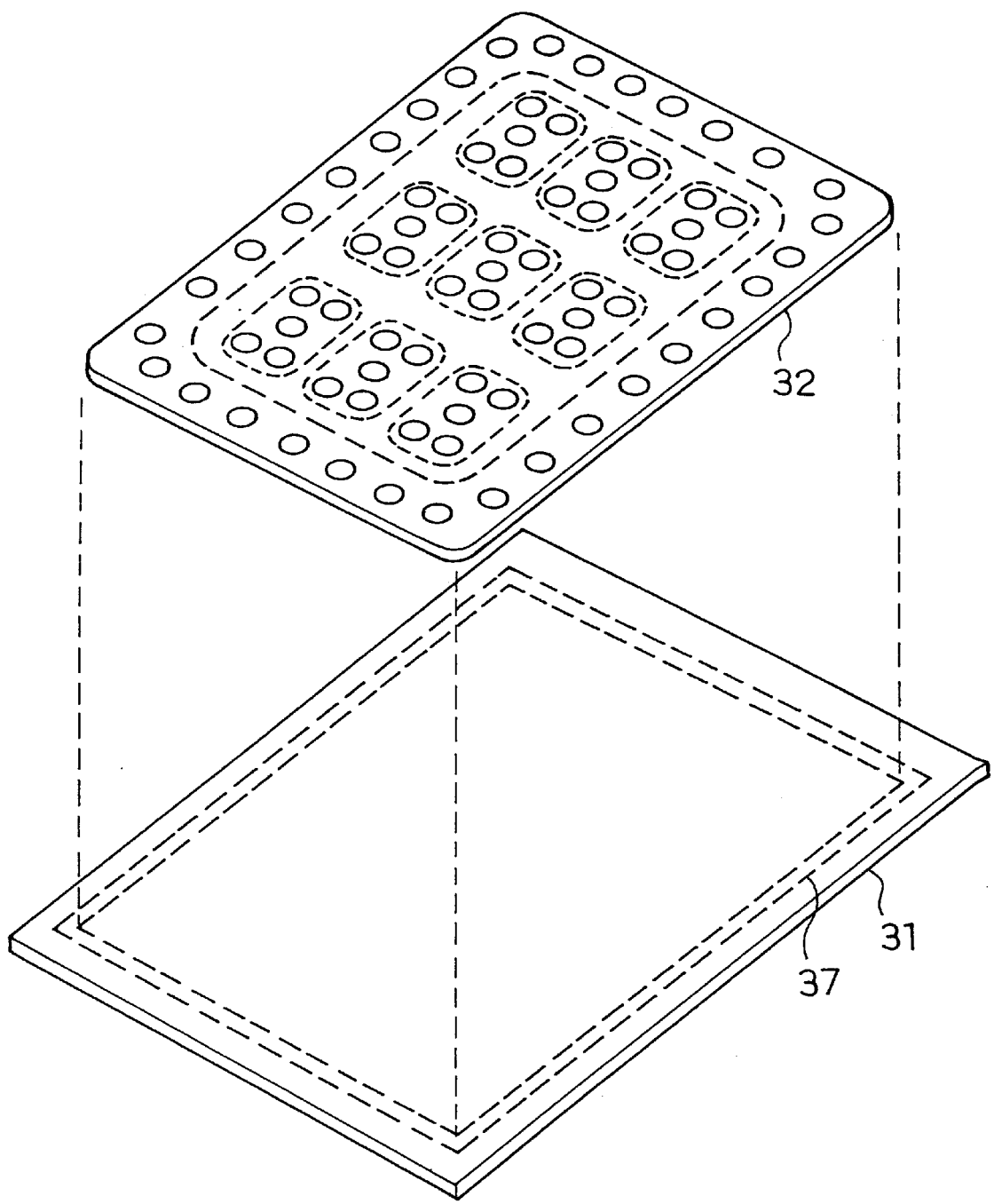
FIG. 24 illustrates another example of a first plate 31 and a second plate 32 of the present invention.

FIGS. 23 and 24 illustrate another example of the openings.

As illustrated in FIGS. 23 and 24, the shape, the size, the number of openings can be various.

FIGS. 23 and 24 illustrate cases of making the size of the first plate 31 greater than the size of the second plate 32.

Figure 25:
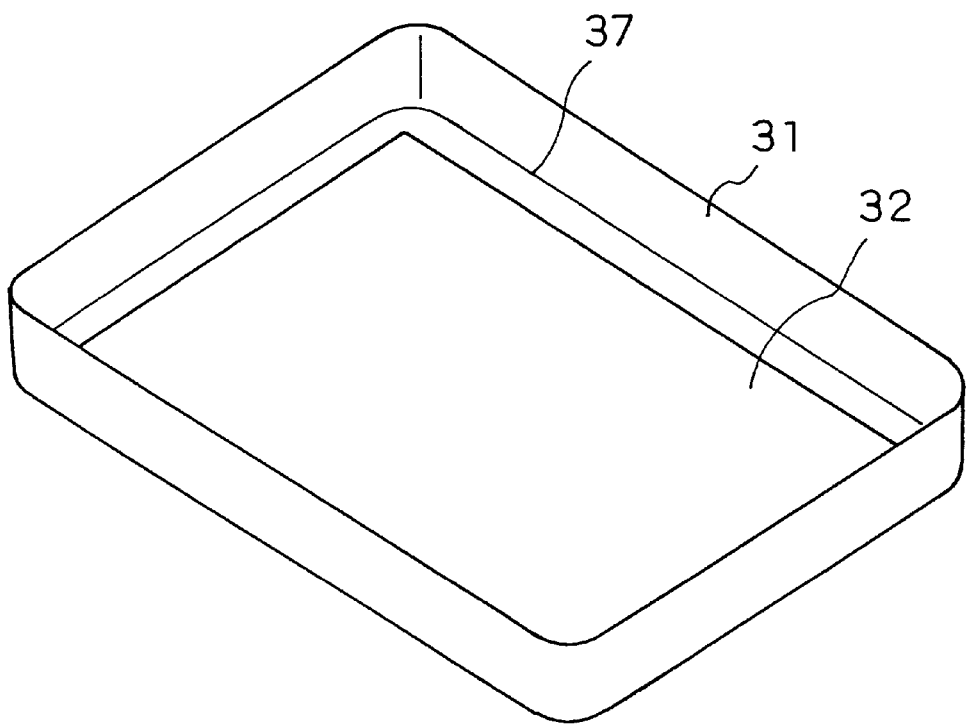
FIG. 25 is a diagram that amended a second plate 32 of the present invention.

The edge of the first plate 31 is bent at a bending line 37 by using bending processing or press-out processing, and a strong box-shaped thermo-siphon is formed as illustrated in FIG. 25. For the case illustrated in FIG. 25, the bent processing or the press-out processing at the bending line 37 is bent by a 90 degree angle. Or, the bend processing at the bending line 37 can also be bent by a 180 degree angle.

Figure 26:
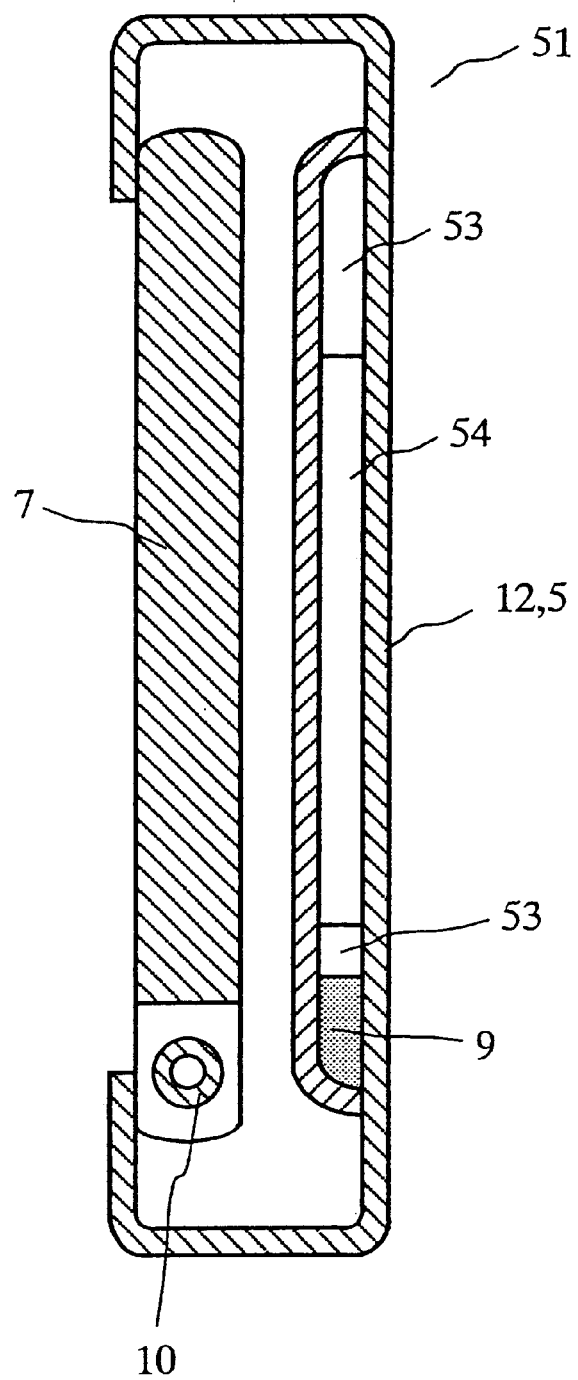
FIG. 26 is illustrates when the heat spreading board 5 is used as the chassis 12 for the present invention.

FIG. 26 illustrate a case of forming a chassis 12 by the press-out processing of the first plate 31. That is, FIG. 26 is the case of adopting the chassis 12 as the heat spreading board 5.

The chassis 12 can also be manufactured using an aluminum plate. Accordingly, the chassis 12 can be used as the heat spreading board 5. Or, the chassis 12 can be used as the thermo-siphon 6.

Figure 27:
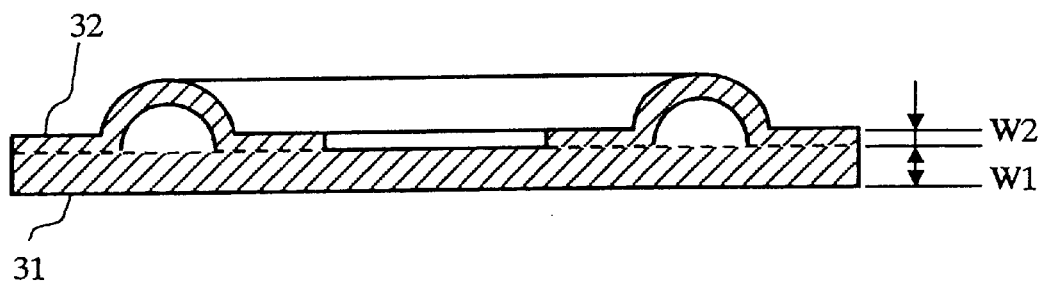
FIG. 27 illustrates a case when the thickness of the first plate 31 and the second plate 32 varies for the present invention.

FIG. 27 illustrates a case of increasing a thickness W1 of the first plate 31 more than a thickness W2 of the second plate 32.

An advantage of FIG. 27 is that even when many openings are installed on the second plate 32, the strength of the thermo-siphon is not reduced.

Figure 28:
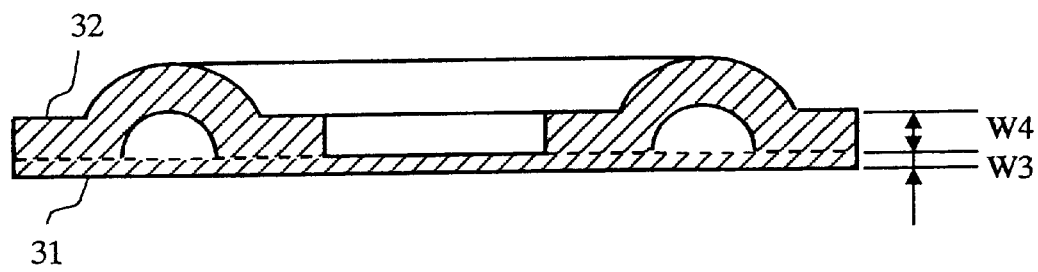
FIG. 28 illustrates a case when the thickness of the first plate 31 and the second plate 32 varies for the present invention.

FIG. 28 illustrates a case of decreasing a thickness W3 of the first plate 31 less than a thickness W4 of the second plate 32.

An advantage of FIG. 28 is that the weight the of thermo-siphon is made lighter than the weight of the thermo-siphon of FIG. 27.

Figure 29:
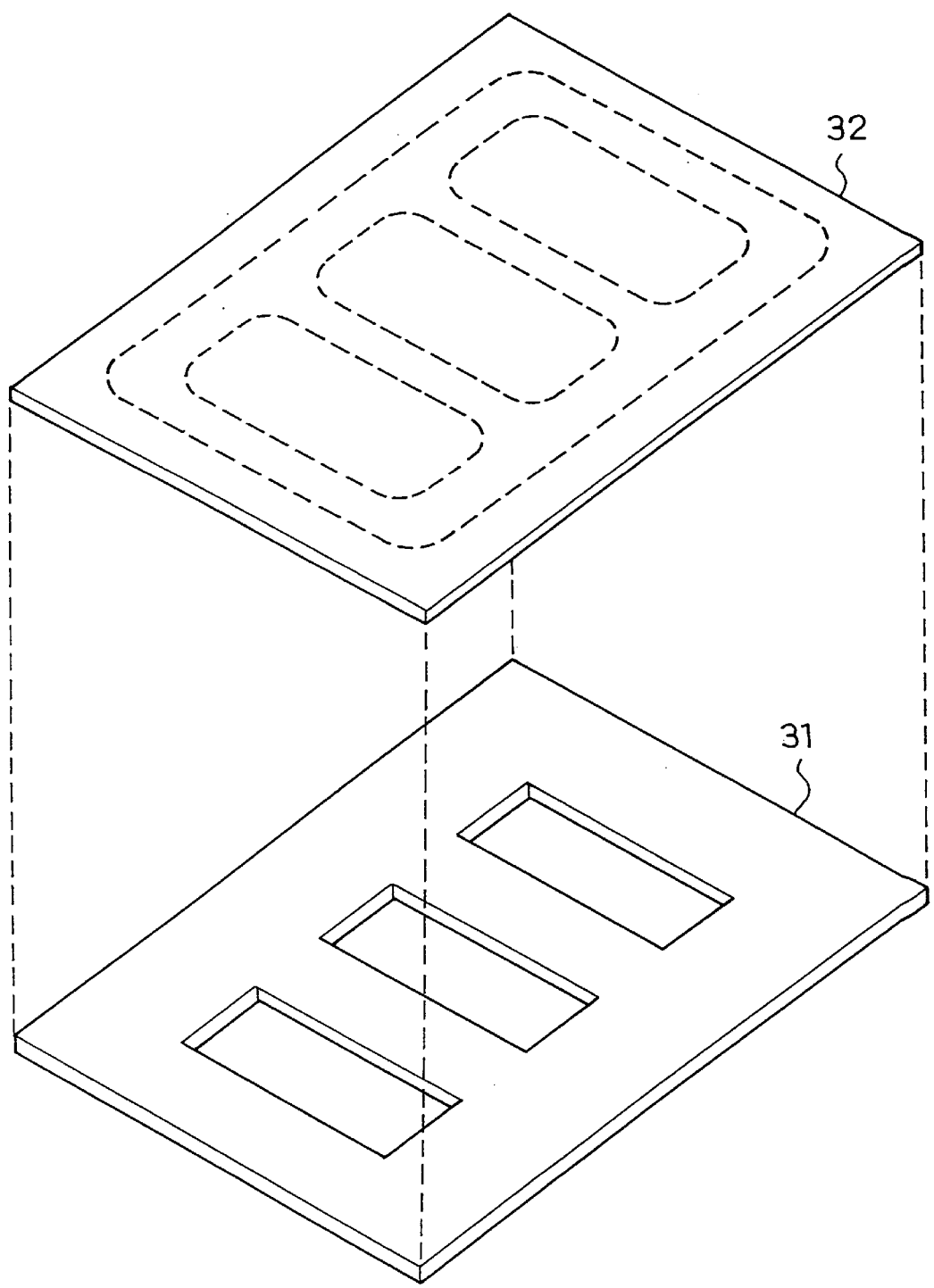
FIG. 29 illustrates another example of a first plate 31 and a second plate 32 of the present invention.

FIG. 29 illustrates a case of installing openings on the first plate 31, not on the second plate 32.

Figure 30:
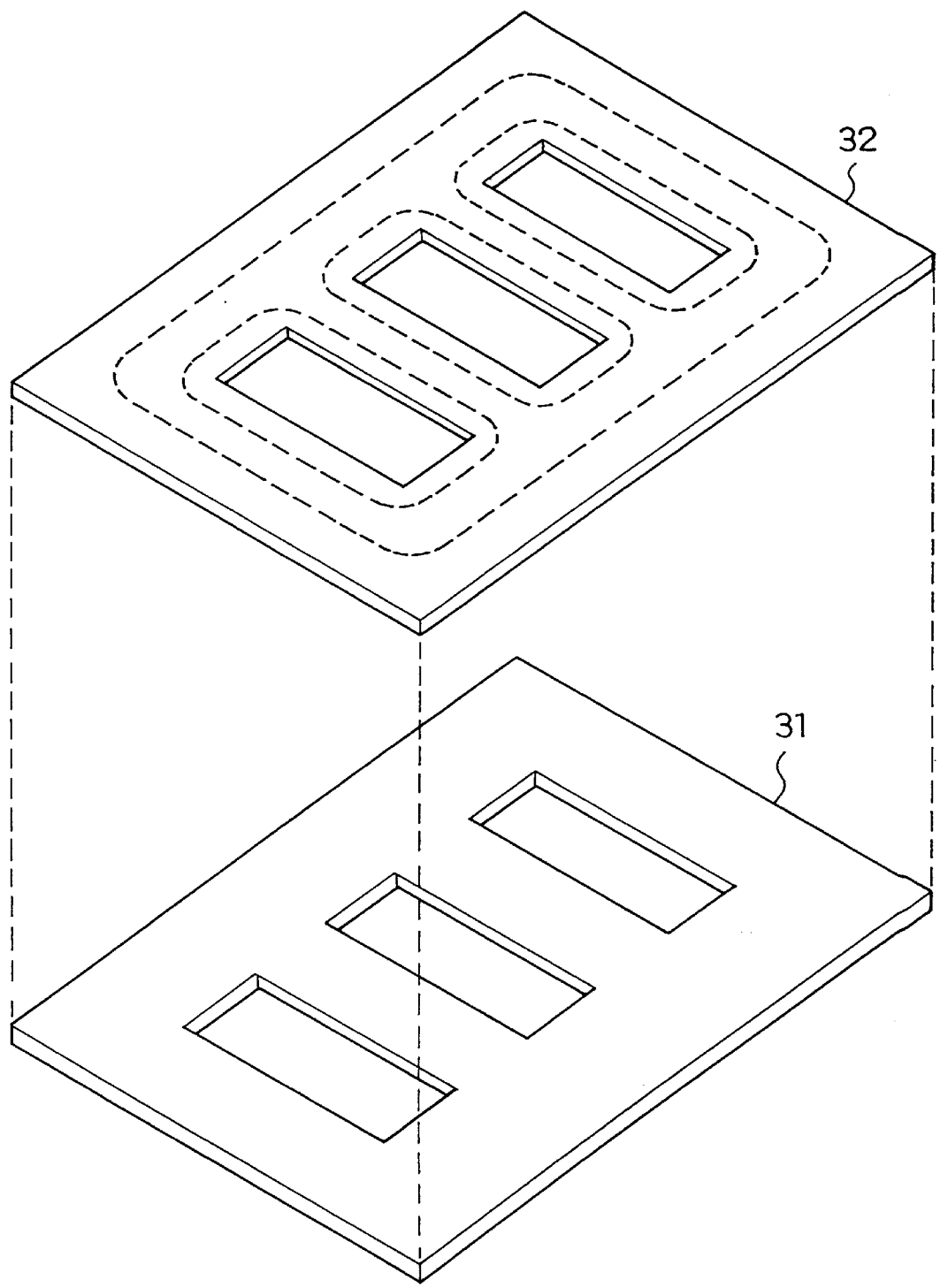
FIG. 30 illustrates another example of a first plate 31 and a second plate 32 of the present invention.

FIG. 30 illustrates a case of installing identical openings on the second plate 32 as the first plate 31.

Figure 31:
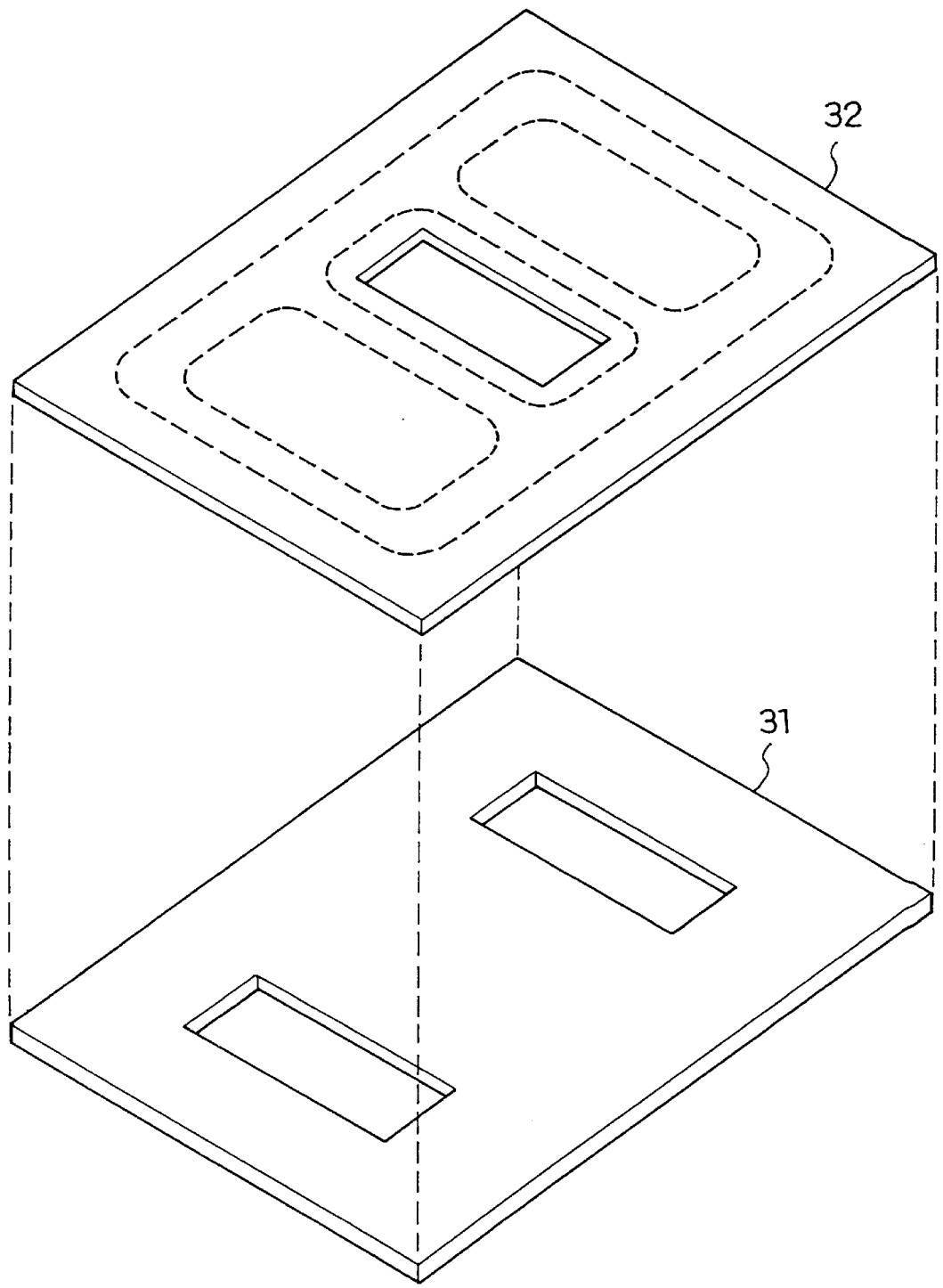
FIG. 31 illustrates another example of a first plate 31 and a second plate 32 of the present invention.

FIG. 31 illustrates a case of installing openings in both the first plate 31 and the second plate 32, and the openings can have various patterns.

Accordingly, the openings can be installed at either one of the first plate 31 or the second plate 32, or, can be installed at both plates.

Instead of the heat pipe, a metal rod having high thermal conductivity or a carbon material which also has high thermal conductivity may be used. Similar effects as in the heat pipe are obtained by using the metal rod and the carbon material having high thermal conductivity.

The invention can be applied not only to the notebook type personal computers but also can be applied to others such as hand-held information processing apparatus, mobile telephones; and mobile facsimile machines.

As described above, according to embodiment 1 of the present invention, a thin part is installed at the heat spreading board of the thermo-siphon, therefore, the weight of the thermo-siphon is reduced.

Also, according to embodiment 1 of the present invention, since the weight of the thermo-siphon is reduced, the weight of the information processing apparatus using the thermo-siphon is reduced.

Further, according to embodiment 1 of the present invention, simply by adding a simple step of installing a lacking part on the plate to a conventional manufacturing method, the weight of the thermo-siphon is reduced.

Embodiment 2.

Hereinbelow, a preferred embodiment of the information processing apparatus is described with reference to the attached drawings.

Figure 32:
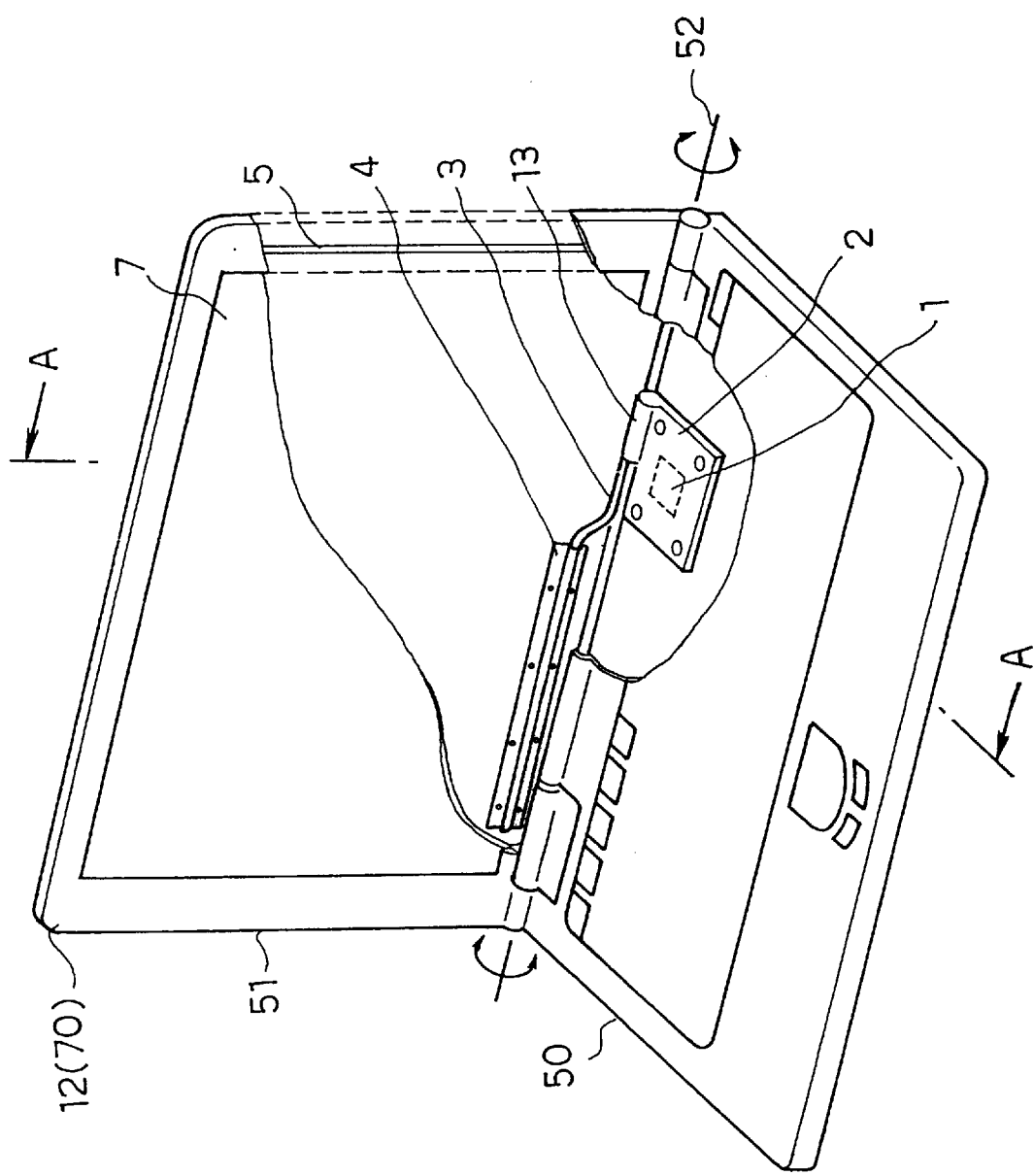
FIG. 32 is a side view illustrating one embodiment of the present invention.

Configuration of the mobile information processing apparatus is described with reference to FIG. 32. Description of the numbered components follows: the main body 50 of a notebook type personal computer; the lid 51 for covering the main body 50; a connecting axis 52 having a hinge structure which connects the main body 50 and the lid 51; CPU (Central Processing Unit) 1 which is a heat generation unit; and the thermally conductive block 2 having a hinge 13 for efficiently collecting heat of CPU and conducting this heat to the heat pipe 3. The thermally conductive block 2 can be made of any material such as metal or carbon, as long as it is thermally conductive material. An axis of the hinge 13 of the thermally conductive block 2 is the same as the connecting axis 52. The heat pipe encloses an adequate amount of liquid (hereinafter a working fluid) inside an exhausted metallic pipe for vaporizing at a fixed temperature. The heat pipe performs highly efficient heat transmission by taking a heat of vaporization at a high temperature side and dissipating heat of condensation at a low temperature side. Inside the heat pipe, the working fluid is circulated by a capillary force of wick having a gutter or a porous structure in a vertical direction installed at an inner wall of the pipe. FIG. 32 further includes the following components: a fastening board 4 for fastening the heat pipe 3 to the heat spreading board 5; the liquid crystal display panel 7; the back light 10; and the external chassis 12 of the lid 51.

Figure 33:
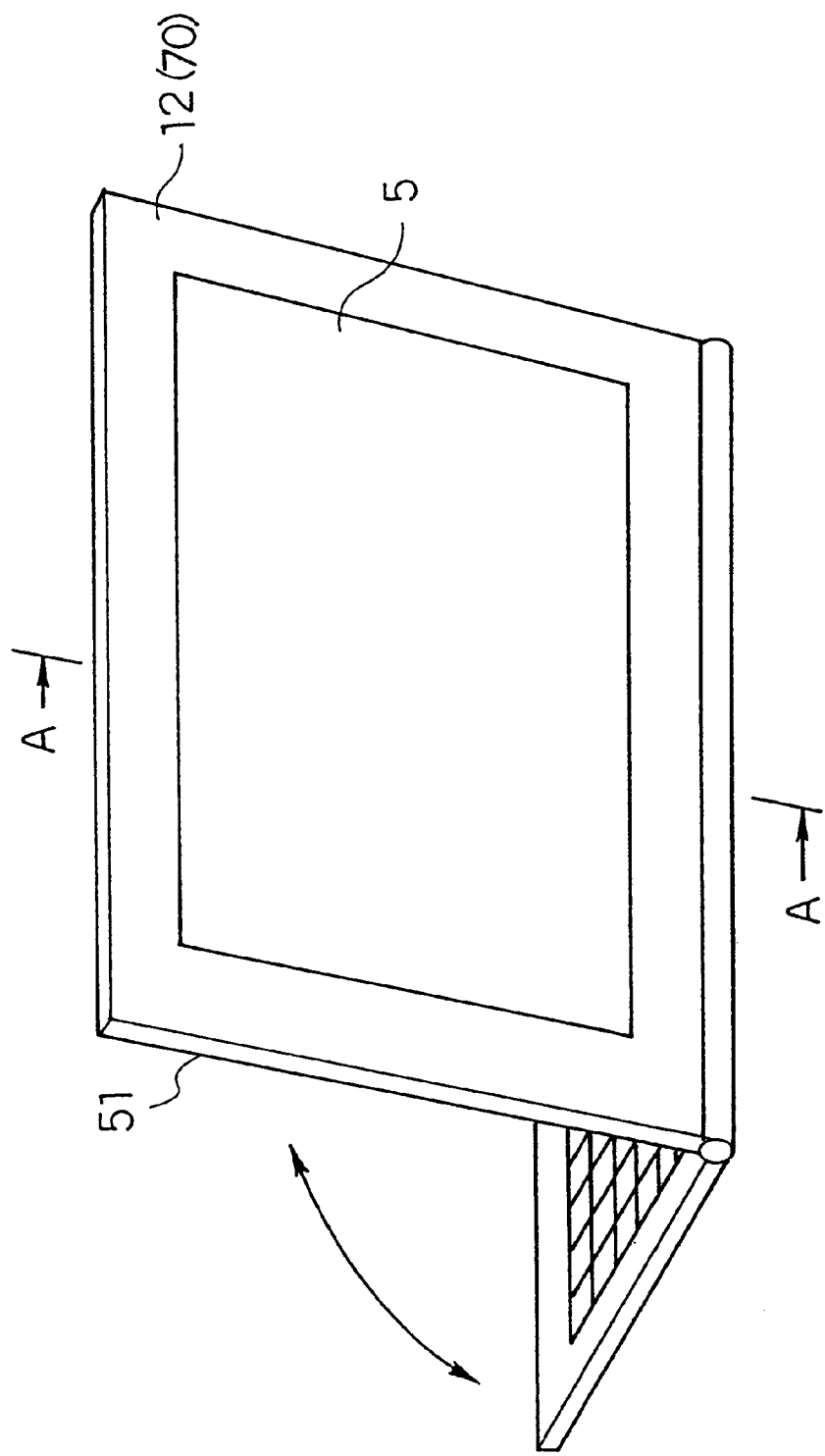
FIG. 33 is a side view of lid illustrating one embodiment of the present invention.

FIG. 33 is the side view of the lid from an outer side.

Figure 34:
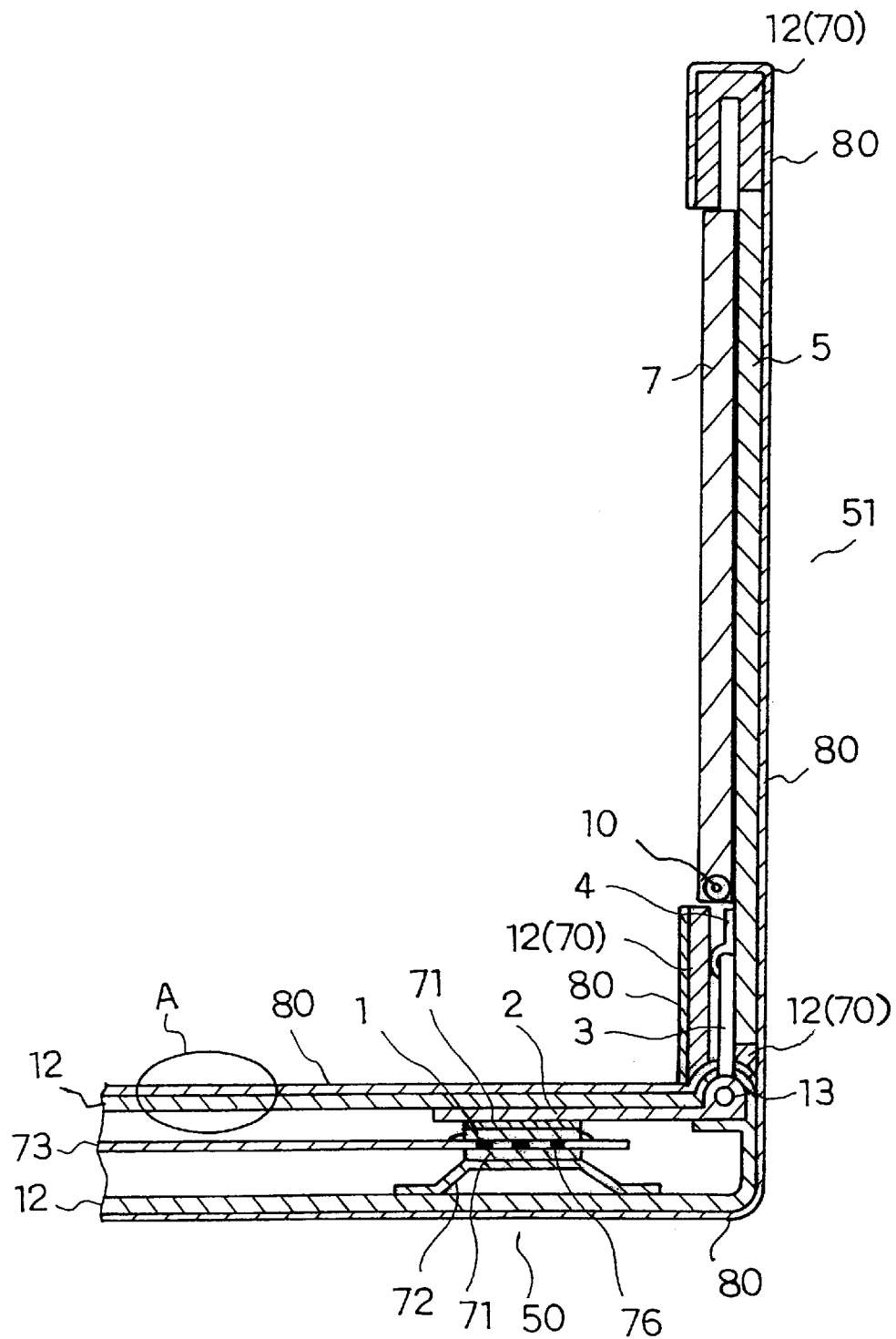
FIG. 34 is a cross-sectional diagram A—A of FIG. 32.

FIG. 34 is the cross-section cut through A—A of FIG. 32.

In the drawing of FIG. 34, a frame 70 forms an outer chassis of the lid 51. The heat spreading board 5 is exposed as a part of the outer chassis 12 of the lid 51. A foaming paint layer 80 is painted on a surface of the chassis 12. A silicon rubber 71 has a high thermally conductive property, and in addition, has an insulating property. A circuit board 73 installs a thermally conductive hole 76 for conducting a heat of the CPU 1. The thermally conductive hole 76 is a via hole or a through hole filled-in by a metal such as steel, which is installed at the circuit board 73.

A thermally conductive plate 72 conducts heat transferred to the chassis 12 via the silicon rubber 71. A material quality of the thermally conductive plate 72 can be of any type as long as it has high thermally conductive property. Also, those that has a spring property is desirable.

Heat spreading processing of the mobile information processing apparatus is described with reference to FIGS. 33 and 34.

The heat generated at the CPU 1 is transferred to the heat pipe 3 via the thermally conductive block 2, and is conducted to the heat spreading board 5 by means of two-phase flow transfer. The heat spreading board 5 is exposed to outside such that the heat dissipation is extremely efficient, and at last the heat spreads to ambient by effect of heat radiation.

In the previously described example, the heat pipe 3 is being used. Instead of the heat pipe, the flexible sheet 8 having a high thermally conductive property such as graphite or carbon fiber may be used. Or, a wire rod having a high thermally conductive property may be used. Similar effect as in the heat pipe is obtained by using the wire rod.

A preferred example of the material of the heat spreading board 5 as illustrated in FIG. 34 is aluminum. Also, a preferred example of the material of the frame 70 is magnesium. Compared to aluminum, magnesium is a material that is easily processed for the bending processing and the press-out processing, as well for other mechanical processing. Accordingly, as illustrated in FIG. 34, the heat spreading board 5 uses a flat aluminum board, and the frame 70 uses a mechanical processing molded products made of magnesium.

Instead of magnesium, other material that is easily processed may be used. For example, a plastic processing product or a resinous processing product may be used. Also, instead of aluminum, a graphite or steel may be used as the material forming the heat spreading board 5.

For the liquid crystal display panel adopting a thin film transistor (TFT), a temperature difference inside the liquid crystal display panel needs to be controlled, because, due to a temperature dependency of a liquid crystal, the temperature difference can cause a color variation and a display inconsistency of the panel. In the drawing of FIG. 34, the heat spreading board 5 and the liquid crystal display panel 7 are closely attached together, therefore, the heat of the liquid crystal display panel 7 is conducted to the heat spreading board 5, which gives an effect of preventing addition of heat or increased temperature partially or throughout the liquid crystal display panel 7. If the temperature of the heat spreading board is not so high, or, if there is a large temperature difference in the liquid crystal display panel 7 due to the heat being generated by the back light, by closely attaching the liquid crystal display panel 7 and the heat spreading board 5, the heat spreading board 5 is cooled together with the liquid crystal display panel 7. Accordingly, the display inconsistency is removed by equalizing the temperature profile of the liquid crystal display panel 7, and this improves the display quality.

Figure 35:
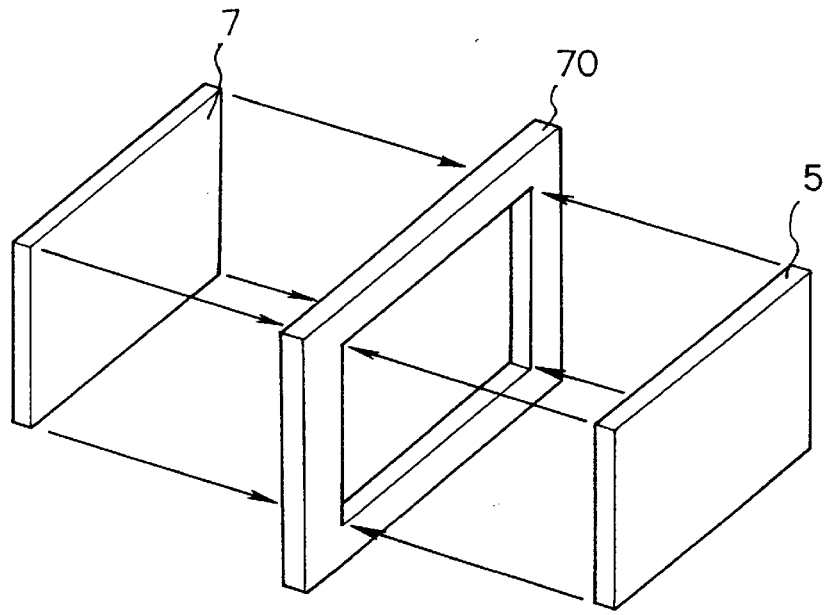
FIG. 35 is a disintegrated diagram of the lid.

With reference to FIG. 35, a configuration to assemble the heat spreading board is described.

Figure 36:
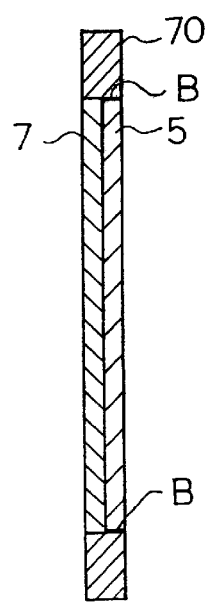
FIG. 36 is a cross-sectional diagram of FIG. 35.

FIG. 36 is the cross-section of FIG. 35.

In the drawing of FIG. 36, the frame 70 and the heat spreading board 5 is attached together at "B" by using an adhesive.

As a material of the heat spreading board 5, for example, aluminum is used. Or, as a material of the frame 70, for example, magnesium is used. The cases illustrated in FIGS. 35 and 36 shows the adhesive being applied to the surrounding edge of the heat spreading board 5, and the heat spreading board is pasted at inner side of the frame 70. Since a coefficient of thermal expansion of aluminum is greater than a coefficient of thermal expansion of magnesium, it is preferable to make both coefficients equal. For example, in order to reduce the coefficient of thermal expansion of aluminum, mix an additive having a smaller coefficient of thermal expansion than the aluminum. As one example of such an additive, a carbon fiber can be mixed with the aluminum. By mixing-in the carbon fiber, the coefficient of thermal expansion of aluminum decreases. As such, the coefficient of thermal expansion for both aluminum with carbon fiber being mixed-in and magnesium can be made equal.

Instead, an additive having a larger coefficient of thermal expansion than magnesium may be mixed with the magnesium.

Figure 37:
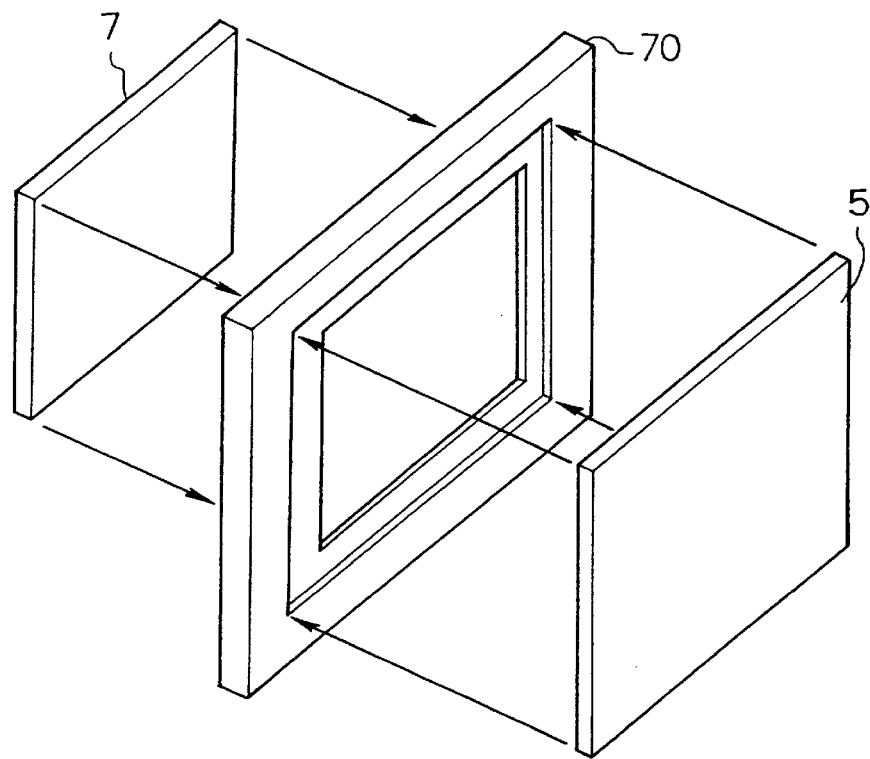
FIG. 37 is a disintegrated diagram of the lid.

With reference to the drawing of FIG. 37, another configuration for assembling the heat spreading board is described.

Figure 38:
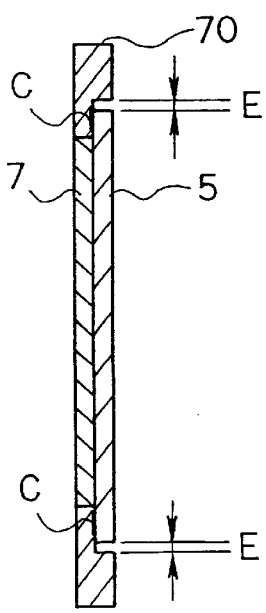
FIG. 38 is a cross-sectional diagram of FIG. 37.

FIG. 38 is the cross-section of FIG. 37.

As illustrated in FIG. 38, a frame 70 and the heat spreading board 5 are attached together at "C" using the adhesive. Also, as illustrated in FIG. 38, a gap E is installed in between the frame 70 and the heat spreading board 5, and even if the coefficient of thermal expansion of the frame 70 and the coefficient of thermal expansion of the heat spreading 5 varies, a damage from the thermal expansion will not occur. As illustrated in FIG. 38, when installing the gap E, the coefficient of thermal expansion of the frame 70 can be larger. Or, the coefficient of thermal expansion of the heat spreading board 5 can be larger.

Figure 39:
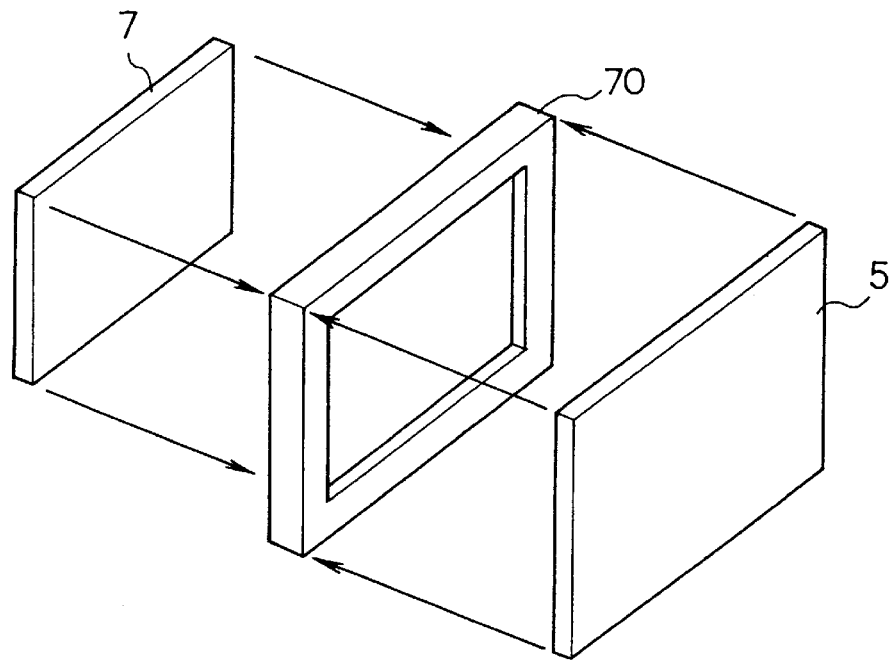
FIG. 39 is a disintegrated diagram of the lid.

With reference to the drawing of FIG. 39, another configuration for assembling the heat spreading board is described.

Figure 40:
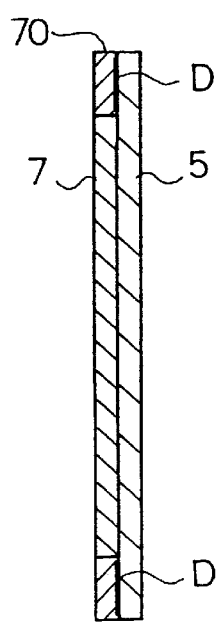
FIG. 40 is a cross-sectional diagram of FIG. 39.

FIG. 40 is the cross-section of FIG. 39.

In the drawing of FIG. 40, the frame 70 and the heat spreading board 5 is attached together at "D" by using the adhesive. For the case illustrated in FIG. 40, there will be no problem even if the coefficient of thermal expansion of the frame 70 and the heat spreading board 5 are not identical.

In recent years, particularly for mobile electronic devices represented in the mobile computing, a technique to implement a product with small-sized, high-performance and lightweight are the key points. From such background, in mobile computing, the use of metallic substrate formed by die-casting is on an increase, from its excellence in terms of strength against weight. Comparing the metallic substrate with the conventional resinous substrate, the thermal conductivity is 100~1000 times greater than that of the metallic substrate. Therefore, the metallic substrate is advantageous for spreading heat.

The present invention attempts to implement a method to deal with the touching warmth, by devising the surface processing method based on the coating method, maintaining advantages such as designs, surface applicability, productivity and low manufacturing cost.

Particularly, the present invention aims to soften the touching warmth at the surface of metallic mobile electronic devices, improve design/appearance of the product, and supply coating that is resistant to abrasions.

The concepts of "insulating heat" and "softening the touching warmth" according to the present invention are two different concepts. What is meant by "insulating heat" is to isolate the heat and the heat is not transmitted. For example, consider a case when the heat is generated inside the mobile electronic device. In this regard, the meaning of "insulating heat" is to shut the heat being generated in the mobile electronic device and this will result in a damage of the device. On the other hand, the meaning of "softening the touching warmth" is to reduce the heat flow to the hand. When the heat being generated from inside the device spreads to outside of the substrate surface, the amount of heat flow to hand has to be reduced. That is, the technique of "softening the touching warmth" for the present invention must satisfy the following two contradicting requirements, namely: spreading the heat generated inside the mobile electronic device through the substrate surface; and removing an unpleasant sensation perceived by the human body from the spreading heat. Thus, the present invention aims to provide a coating technique to ease the heat influence on the human body as well as maintaining the heat spreading property.

Figure 41:
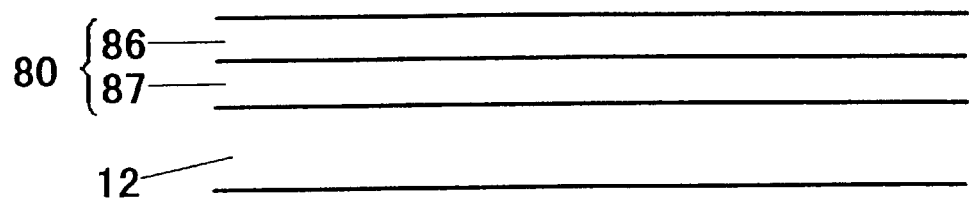
FIG. 41 is a cross-sectional diagram of paint layer 80 of the present invention.

FIG. 41 is a side view of the surface coated substrate for part indicated in A in FIG. 34.

As a metal chassis 12, for example, pure magnesium or a magnesium alloy is used. Or, pure aluminum or an aluminum alloy may also be used. Alternatively, other light metals with a density less than 4.0 g/cm$^3$ or 5.0 g/cm$^3$ may be used.

Generally, it is difficult to apply a thick coating, therefore, a resinous coating material 87 is applied first to form a base to increase a thickness of thermally insulating coating, so as to increase a thickness of the surface processed layers, and this will reduce the touching warmth at the surface. For use as the base material, vinyl chloride resin is suitable, where a thickness greater than 100 microns has proved to be effective as the base material. In the present embodiment, different types of paint materials (paint 86 and resinous coating material 87) are arranged to form a multi-layered films to increase the thickness of surface processed layers, thereby improving the touching warmth property. The following macromolecular compounds (polymers) are examples that can be applied other than vinyl chloride resin: acrylic resin, fluorocarbon polymers, vinyl resin, phenol resin, polyester, epoxy resin, polyethylene, rubber, urea resin, meramine resin, polyurethane, silicone resin, and polyamide. These polymers can either be used alone or in combination.

Figure 42:
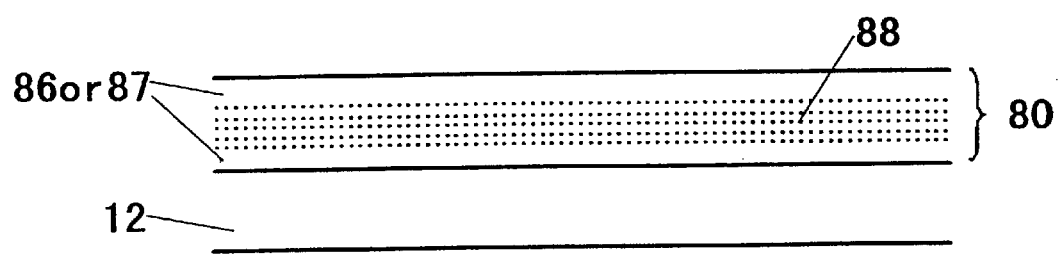
FIG. 42 is a cross-sectional diagram of paint layer 80 of the present invention.

FIG. 42 is the cross-section for a case of incorporating the thermally insulating layer, prepared by applying a paint made from mixing a fibrous insulating filler material 88 with the paint 86. The touching warmth is reduced by using the paint made from the mixing of insulating filler material 88 with the paint 86 because it lowers the thermal conductivity of the film layer.

Specific examples of the insulating filler materials 88 are the materials with a low value of thermal conductivity and effective insulation, such as mica or pearlite. Other than mica or pearlite, inorganic particles such as diatomaceous earth ($SiO_2+H_2O$), alumina powder ($Al_2O_3+nH_2O$), calcium carbonate ($CaCO_3$), and titanium oxide ($TiO_3$) can be used. Fibrous materials of cattle leather and mixed leathers can also be used. The insulating filler material 88 also acts as a weight increaser, thereby increasing the thickness of film layer. The paint can also be made from mixing the insulating filler material 88 with the resinous coating material 87.

Figure 43:
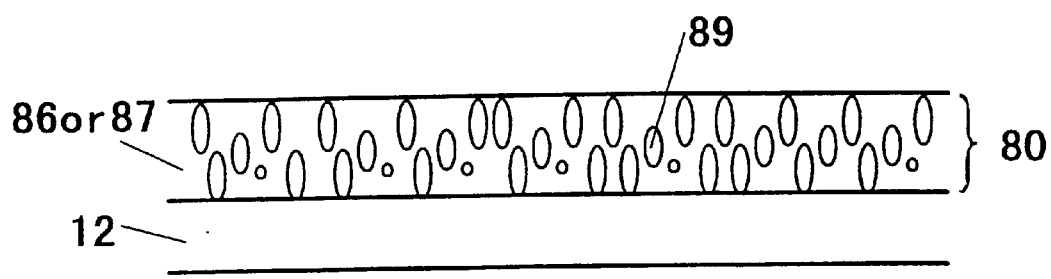
FIG. 43 is a cross-sectional diagram of paint layer 80 of the present invention.

FIG. 43 is the cross-section of an embodiment of the surface coated substrate that incorporates a plurality of granulated insulating materials 89 in the film layer.

The specific examples of the granulated insulating materials 9 are materials with a low value of thermal conductivity and effective insulation, such as cork powder or hollow beads to make gaseous entrapments, for example, air entrapments and hydrocarbon entrapments, inside the film. The thermal conductivity of the film layer will be effectively lowered to reduced the touching warmth. The granulated insulating materials can also become a weight increaser, therefore, it is able to increase the thickness of film layer. The granulated insulating material 89 can also be mixed with the resinous coating material 87. Other than the hollow beads, following can be used: carbon balloon, acrylic and styrene, silicate mineral, silica-alumina fiber, and glass. The hollow beads and other materials such as carbon balloon can either be used alone or in combination.

Figure 44:
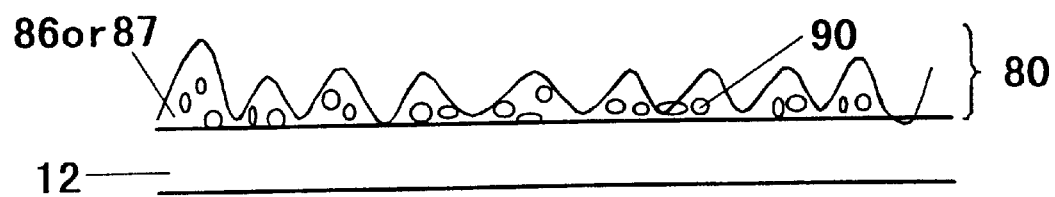
FIG. 44 is a cross-sectional diagram of paint layer 80 of the present invention.

FIG. 44 is the cross-section of a surface processed substrate that includes gaseous entrapments by pre-mixing a foaming material 90 with the paint, followed by foaming the mixed material at a high temperature.

A specific example of the foaming material 90, the thermally expandable micro-capsules such as hydrocarbons having a low boiling point are mixed in a normal paint. By heating and foaming the mixed materials, a porous structure is formed in the painted film, thereby reducing the thermal conductivity of the film layer and reducing the touching warmth. The foaming material can also increase the weight and thickness of the film layer. The foaming material 90 can also be mixed with the resinous coating material 87.

Here are some examples of the foaming material 90: foaming glass, foaming concrete, foaming urethane, foaming styrene, foaming polypropylene, and foaming PET (polyethylene terephthalate) can either be used alone or in combination.

Instead of the foaming material 90 the following materials may be included in the paint 86 or resinous coating material 87: alumina powder ($Al_2O_3+nH_2O$), calcium carbonate ($CaCO_3$), and titanium oxide ($TiO_3$), silicate mineral, glass, acrylic and styrene beads. These materials will become a spacer to form gaseous entrapments. When painting the paint 86 and resinous coating material 87, the gaseous entrapments can be formed at the sides of the spacer. In addition, as foaming material 90, monomers having a vapor pressure different from the paint 86 or the resinous coating material 87 can either be used alone or in combination. The gaseous entrapments are formed by volatization of the monomers at the time of painting.

There are two effects from incorporating the minute gaseous entrapments upon painting the foaming paint. As the first, the combined thermal conductivity is decreased by a presence of numerous number of small gaseous entrapments that will be contained in the normal coating. As the second, the thickness of film is increased by a presence of the foamed layer. Compared to the thermal conductivity for the case of normal coating, the thermal conductivity of the layer for the case of using the foaming material is lower by about $\frac{1}{10}$ of the normal coating. This effect of decreasing the amount of heat flow from the aluminum chassis to the hand appears as difference in characteristics for both cases of the normal coating and the coating using the foaming material. Looking from a side of the hand, the heat transfer rate between the finger and the aluminum surface is the dominant heat transmitting parameter. However, with the presence of the foamed layer, the amount of heat flow to hand is eased by controlling the heat transfer rate by the foaming layer. By applying the foaming paint, the heat transfer rate of the painted film will be 440 $(W/m^2K)$, and compare this to the heat transfer rate with those that have applied the normal paint, which is 3750 $(W/m^2K)$, the heat transfer inside the chassis will be difficult, and this results in a heat accumulation inside the mobile electronic devices. However, the heat transfer rate from the surface of chassis upon natural cooling of the mobile electronic device is small of about 10 $(W/m^2K)$ such that even if the heat transfer rate of the painted film has declined to 440 $(W/m^2K)$, the natural cooling of the chassis surface 10 $(W/m^2K)$ has apparently a larger insulating effect in the whole heat spreading system. Therefore, increase in the temperature inside the chassis due to an increase in the thickness of film can be ignored.

Figure 45:
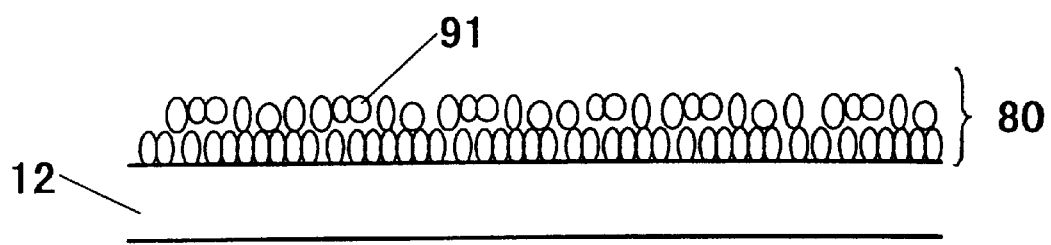
FIG. 45 is a cross-sectional diagram of paint layer 80 of the present invention.

FIG. 45 shows a repeatedly applied layers of bead-containing paint 91, increasing the layer thickness, and incorporated a porous structure with a large amount of gas incorporated in the film layers. Instead of the bead-containing paint 91, a bead-containing resinous coating material and multiple-layered glass are similarly used.

Figure 46:
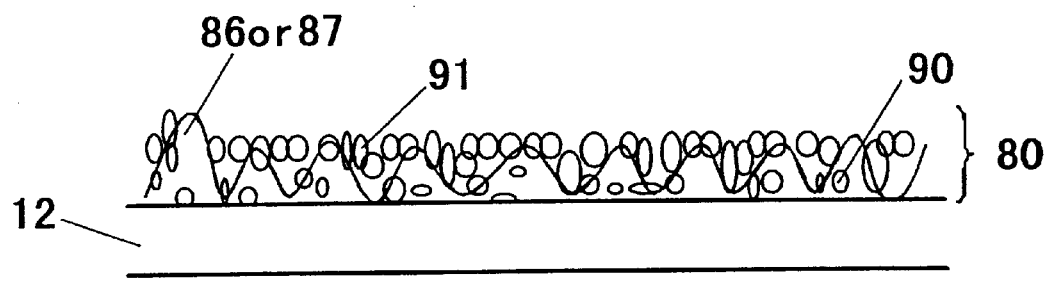
FIG. 46 is a cross-sectional diagram of paint layer 80 of the present invention.

FIG. 46 is the example that combined FIGS. 43 and 44.

In this embodiment, a decline in the restoring strength of the foaming material is supplemented by the top coating with the bead-containing paint 91 because this can increase a hardness at the film surface. The foamed layer is prone to damage due to formations of porous structure and gas layers inside. Such surface of the foamed layer is top coated using a paint with high degree of hardness so that the strength of the film is intensified.

A large difference between the conventional paint and the bead-containing paint is the way in which a pigment component is blended in the paint.

The pigment is dispersed inside the conventional paint as it is. On the other hand, a large amount of "pigment enclosed using special resin to form minute bead-containing paint" or in other words, "pigmented beads" are contained in the bead-containing paint. These beads can give various colors to the paint.

A scope of application is large for a well-balanced combination of the pigmented beads having varied radius. For instance, a suede-like film needs raised naps and knobby feels. In addition to a velvet or back skin and melange-like film that need a minor knobby feels, there is also a paint containing grounded natural collagen fibers with a flat painted surface.

Such processing methods in previously described embodiments are individually effective as well as in combinations, in accordance with various objectives.

Following are examples of combinations, in order, from top to bottom layers.

(1) paint 86 of type number one paint 86 of type number two (same or different from paint type number one) metal chassis plate 12

(2) resinous coating material 87 of type number one resinous coating material 87 of type number two (same or different from resinous coating material of type number one) metal chassis plate 12

(3) paint 86 (or paint 86 mixed with insulating filler material 88, granulated insulating material 89, or foaming material 90)

resinous coating material 87 (or resinous coating material 87 that is mixed with heat insulating filler material 88, powdery insulating material 9 or foaming material 90)

paint 86 (or paint 86 that is mixed with insulating filler material 88 or granulated insulating material 89 or foaming material 90)

metal chassis plate 12

(4) resinous coating material 87 (or resinous coating material 87 that is mixed with insulating filler material 88 or granulated insulating material 89 or foaming material 90)

paint 86 (or paint 86 that is mixed with insulating filler material 88 or granulated insulating material 89 or foaming material 90)

resinous coating material 87 (or resinous coating material 87 that is mixed with insulating filler material 88 or granulated insulating material 89 or foaming material 90)

metal chassis plate 12

(5) bead-containing paint 91 resinous coating material 87 that is mixed with insulating filler material 88, granulated insulating material 89, or foaming material 90)

paint 86 metal chassis plate 12

(6) resinous coating material 87 that is mixed with insulating filler material 88, granulated insulating material 89 or foaming material 90)

bead-containing paint 91 paint 86 bead-containing paint 91 metal chassis plate 12

(7) paint 86 bead-containing paint 91 metal chassis plate 12

(8) resinous coating material 87 bead-containing paint 91 metal chassis plate 12

Various other combinations are also possible.

Using any of the processing methods mentioned previously, the hand contact area will be reduced by intentionally incorporating the rough surface, and reducing the thermal conductivity to the hand, so that excessive rise in touching warmth is prevented.

Figure 47:
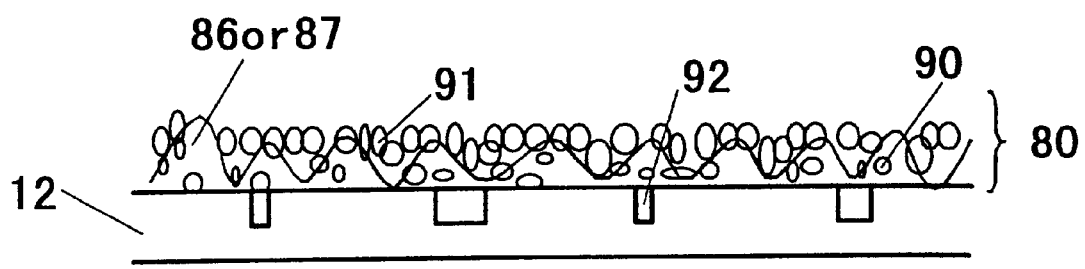
FIG. 47 is a cross-sectional diagram of paint layer 80 of the present invention.

FIG. 47 shows an embodiment that appropriately combines the surface processing methods mentioned previously, as well as aiming to fill a dent, wrinkle or scar at a surface formed during molding in die-casting. In the die-casting of metal chassis made of magnesium or aluminum, small dents or wrinkles 92 occur on its surface at an ejection stage, and repairs are generally made by puttying. A dent on the surface is a detriment that occurs during casting. A surface wrinkle is formed during casting when molten metal flows into a void casting frame. In practice, the method thick layer coating as described previously has a filling effect and conceals dents or wrinkles 92. Thus, for those small detriments, there is no requirement to repairs with puttying, thereby reducing costs, decreasing the number of processing steps, and improving quality.

Generally, for electronic devices, the metal chassis plate 21 becomes hot due to a heat generated from the heating device. By applying paint and resinous coating material in multiple layers, or by applying paint and/or resinous coating material that are mixed with a high proportion of insulating material, the insulating layer structure is incorporated in the film layer. Also, the mixing of insulating material is effective in reducing the amount of heat flow to a hand. Also, mixing of the foaming material to form a foamed structure can create a rough structure at the surface of film which can reduce the touching warmth and effective in reducing the amount of heat flow to a hand. Also for a metal chassis that became too hot, painting the paint or resinous coating material including the insulating material and gaseous entrapments can lower the thermal conductivity, so, the touching warmth reduction is improved significantly. Also, by intentionally forming a rough surface of a substrate, the contact area upon handling is reduced and effectively lowering the thermal conductivity to a hand. That is, the amount of heat flow to a hand is reduced by reducing the heat flow from the moment of handling the metal as well as afterward, reducing the touching warmth.

The surface processing is done on various portions: throughout the external cover; to apart subjected to a change in temperature (e.g., the elliptical region of FIG. 1); and to a part where there is a possibility of handling.

Figure 48:
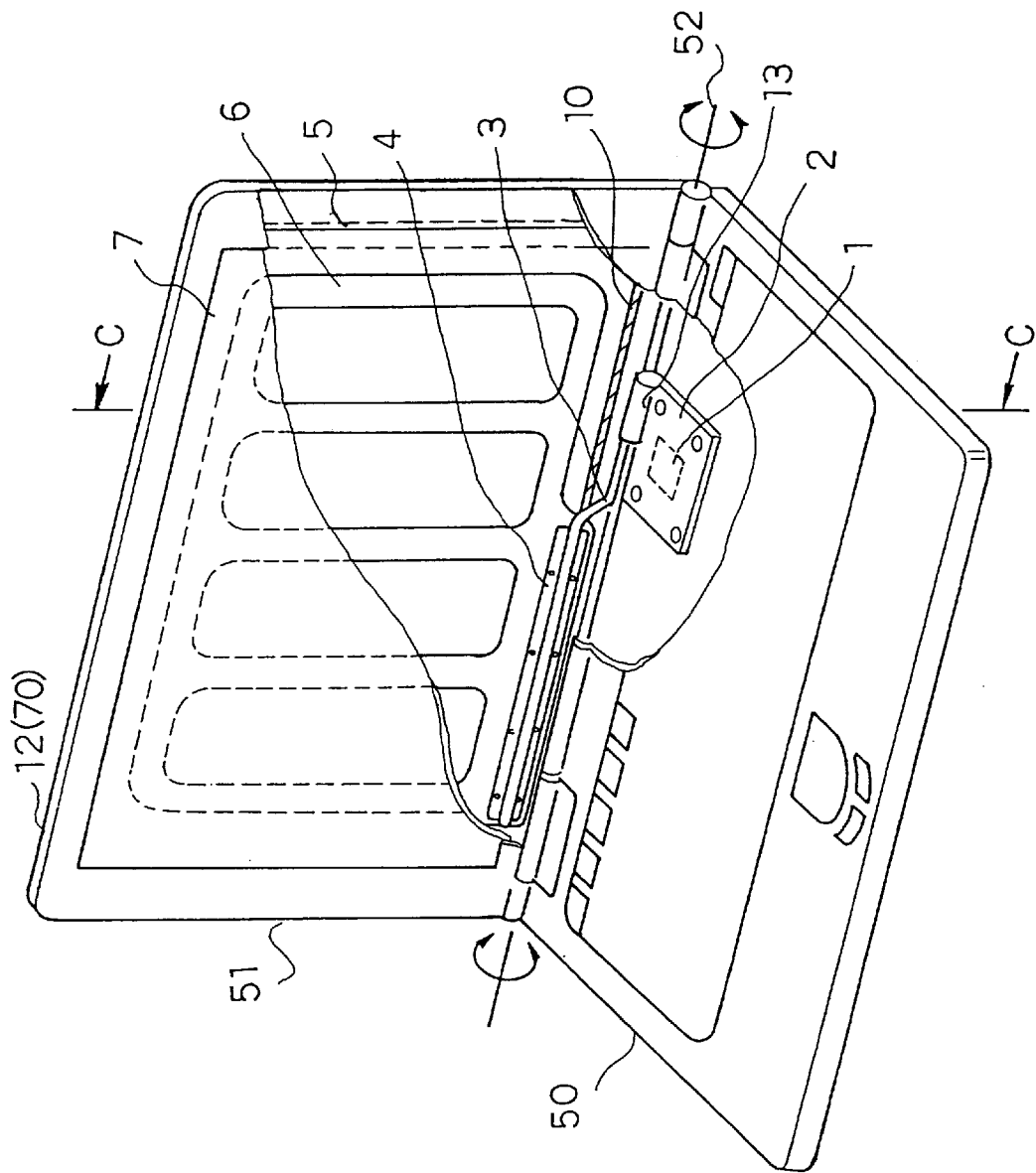
FIG. 48 is a side view illustrating one embodiment of the present invention.

FIG. 48 illustrate another configuration of the mobile information processing apparatus.

In the drawing of FIG. 48, the numbered components are same as those indicated in FIG. 32. Hereinbelow, particularly, different points are described.

Figure 49:
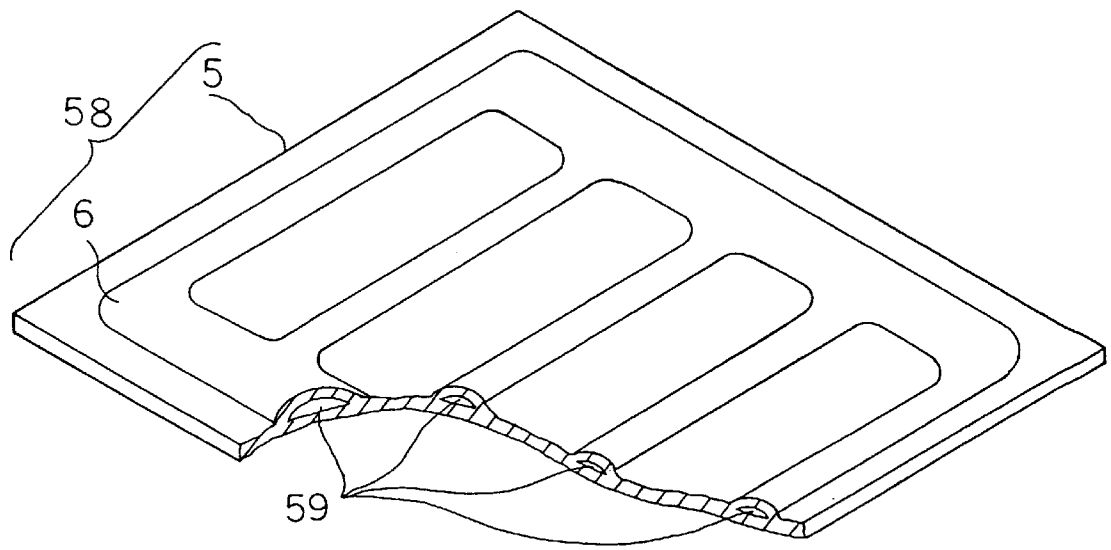
FIG. 49 is a partially broken side view of the thermo-siphon and the heat spreading board illustrating one embodiment of the present invention.
Figure 50:
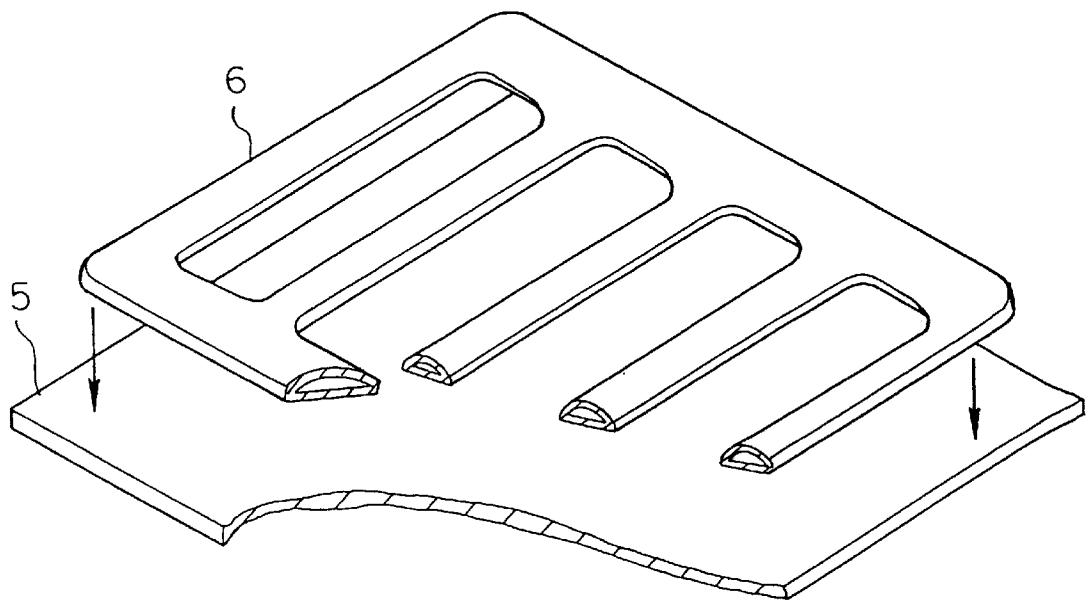
FIG. 50 is a partially broken side view of the thermosiphon and the heat spreading board illustrating one embodiment of the present invention.

The thermo-siphon 6 is formed on the heat spreading board 5. Both the thermo-siphon 6 and the heat pipe 3 performs highly efficient heat conduction under the same principal. However, normally in the thermo-siphon 6, there is no porous structure or gutter in a vertical direction installed at inner wall of the pipe, and therefore, the working fluid is not circulated by using the capillary force of the wick. Accordingly, the thermo-siphon 6 circulates the working fluid along the flow channel by using the gravity. For example, the roll bond panel 58 made by Showa Aluminum Kabushiki Kaisha can be used as the thermo-siphon 6. As illustrated in the drawing of FIG. 49, the roll bond panel is a component having a hollow flow channel 59 inside the aluminum plate. By using the roll bond panel, the heat spreading board 5 and the thermo-siphon 6 is formed as one. Alternatively, the heat spreading board 5 and the thermo-siphon 6 can be made independently, as illustrated in FIG. 50.

The heat spreading processing of the mobile information processing apparatus is described with reference to drawing of FIG. 51.

Figure 51:
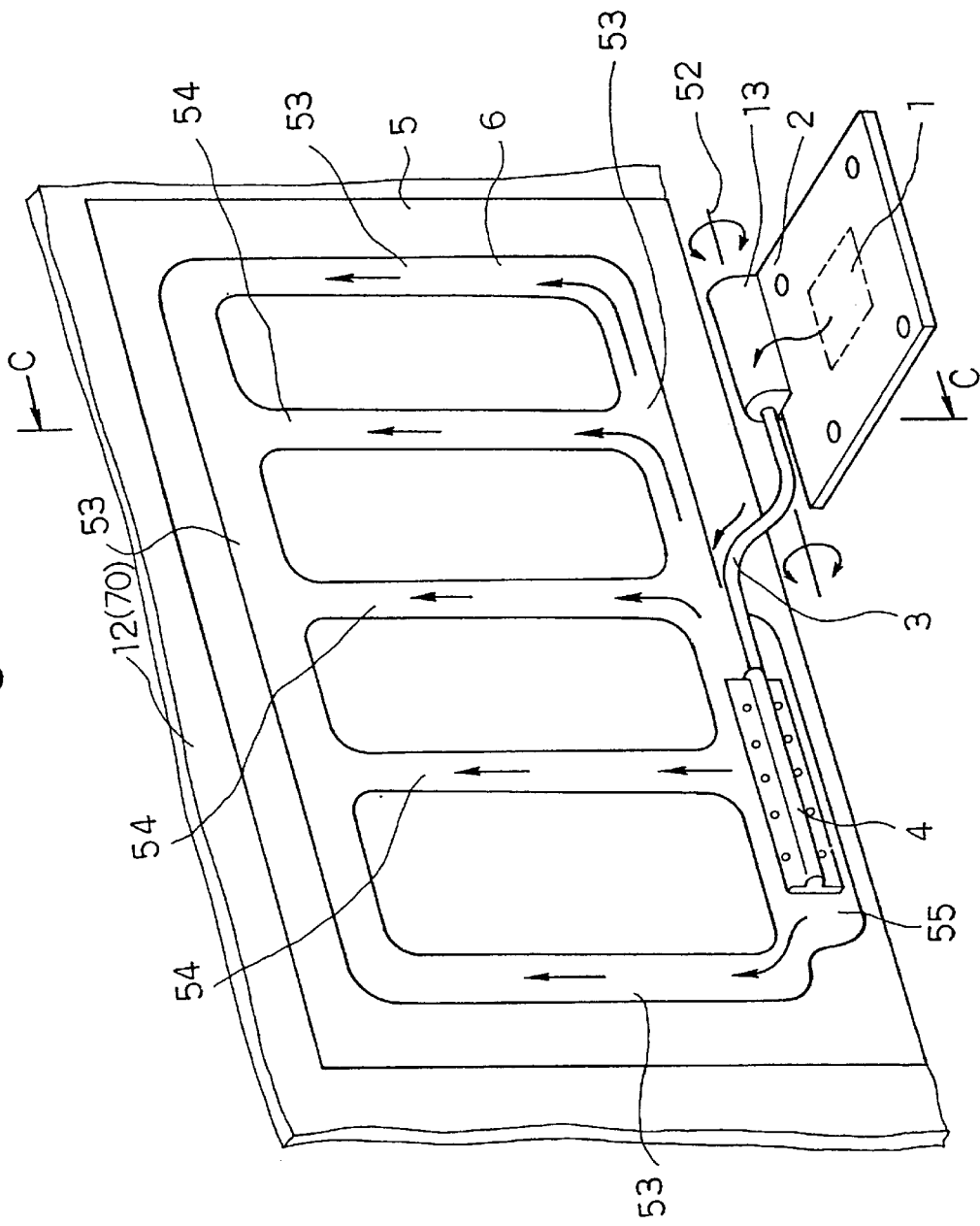
FIG. 51 is a side view illustrating one embodiment of the present invention.
Figure 52:
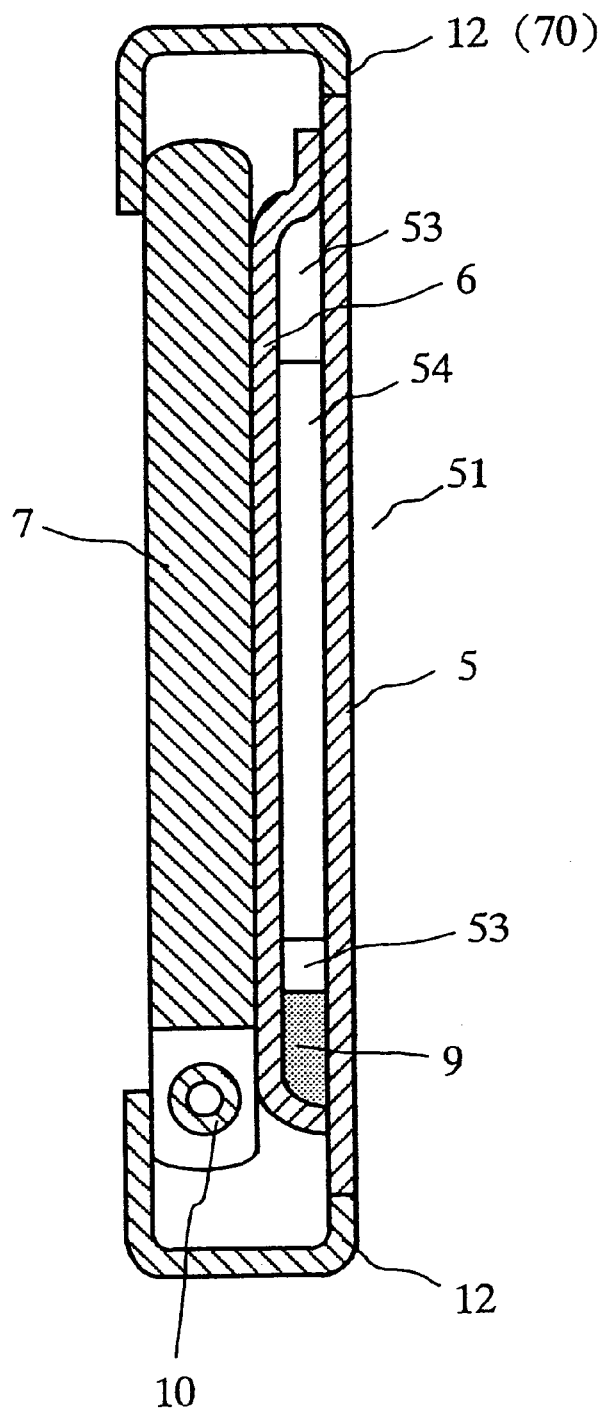
FIG. 52 is a cross-sectional diagram C—C of FIG. 48.

FIG. 52 is a cross-section cut through C—C of FIG. 51.

The thermo-siphon 6 has the liquid reservoir 55 for collecting the working fluid 9. Also, the thermo-siphon 6 has the vapor flow channels 53 and 54 for circulating the working fluid 9 in the plane direction of the plane of the heat spreading board 5. A case shown in FIG. 51 illustrates a first flow channel 53 for circulating around a periphery of the heat spreading board 5, and also illustrates second flow channels 54 for extending along to a perpendicular direction to the connecting axis 52, which joins to the first flow channel 53.

Normally, liquid such as fluorinate or water is injected as the working fluid 9 to the liquid reservoir and the flow channels. After the injection, the liquid reservoir and the flow channels are decompressed and air-tightly sealed. The working fluid 9 will be collected at a lower part of the liquid reservoir due to an effect of the gravity, however, by making a high temperature heat source such as heat pipe to attach to the lower liquid reservoir, the heat is conducted to the working fluid, which turns it into a vapor to cause an ascending vapor flow to a lower temperature part. When the heat is transferred accordingly, and the vapor flow is condensed to spread the heat inside the vapor flow channel. The working fluid is liquefied by the condensation and falls down the vapor flow channel under its own weight. That is, inside the thermo-siphon, the heat of vaporization is transferred by the circulation and the flow back of the working fluid under the effect of gravity. An effective heat transfer and the heat equalization occurs by heat transmission processes such as condensation and heat spreading. Comparing a use of the thermo-siphon to the heat conduction by using a metal only, one can expect a large improvement in a cooling capability.

The heat spreading method is same as the flow chart illustrated in FIG. 6.

The thermo-siphon 6 has a thickness of 1~2 mm, therefore, this is made much thinner than a case of installing a fan. Also, the fan will not be needed even for CPU which desires a use of the fan, and the thermo-siphon 6 can bring about a greater heat spreading effect over the fan.

Figure 53:
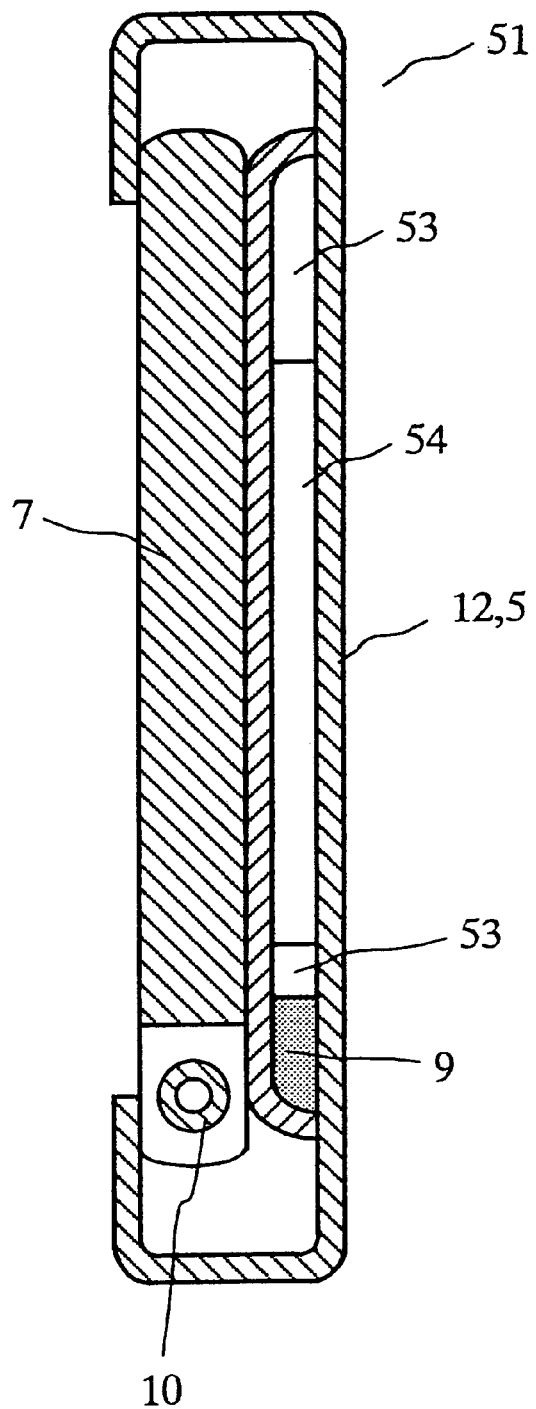
FIG. 53 is a cross-sectional diagram manufacturing the heat spreading board 5 and the chassis 12 as one.

FIG. 53 illustrates a case of using the chassis 12 as the heat spreading board 5. The chassis 12 is also possible to be made by the aluminum plates. Therefore, the chassis 12 can be used as the heat spreading board 5 itself. Alternatively, it is possible to use the chassis 12 as the thermo-siphon 6.

Figure 54:
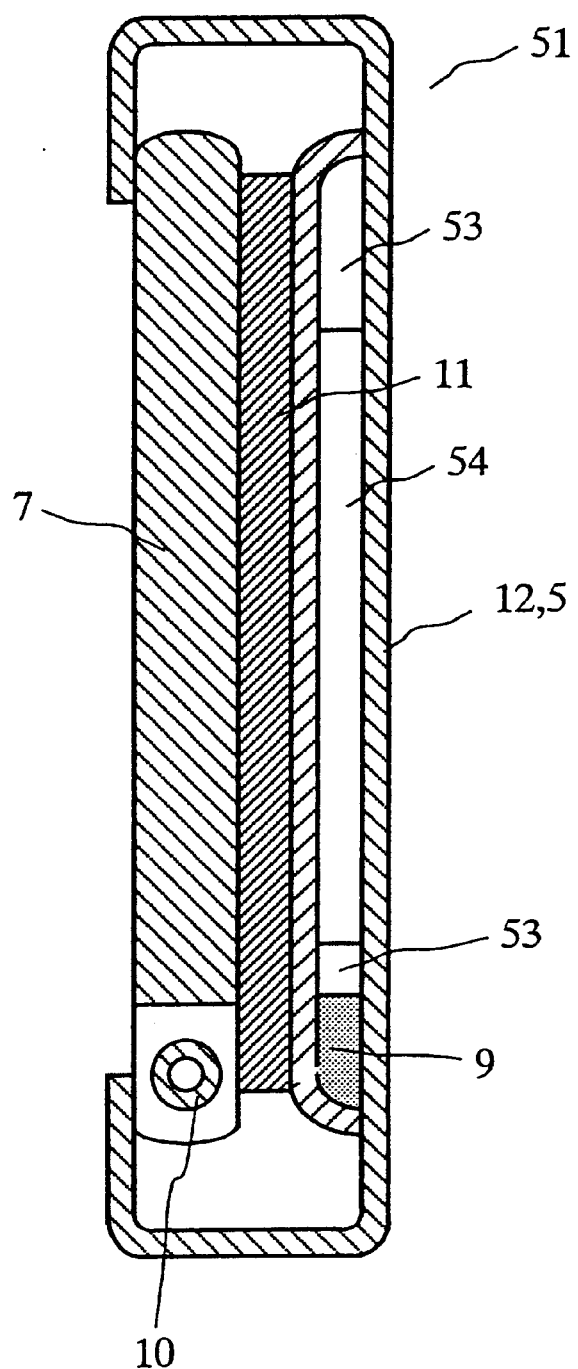
FIG. 54 is a cross-sectional diagram installing the thermally conductive sheet 11 in between the liquid crystal display panel 7 and the heat spreading board 5.
Figure 55:
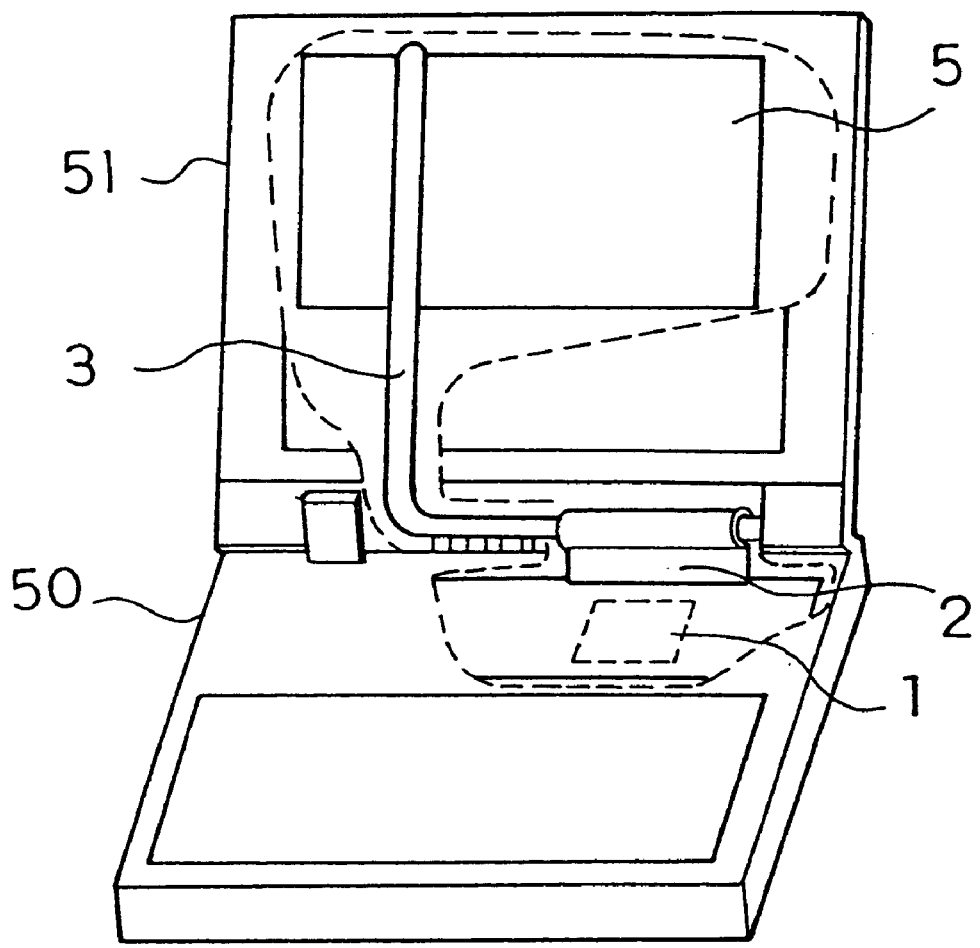
FIG. 55 is a conventional heat spreading configuration.
Figure 56:
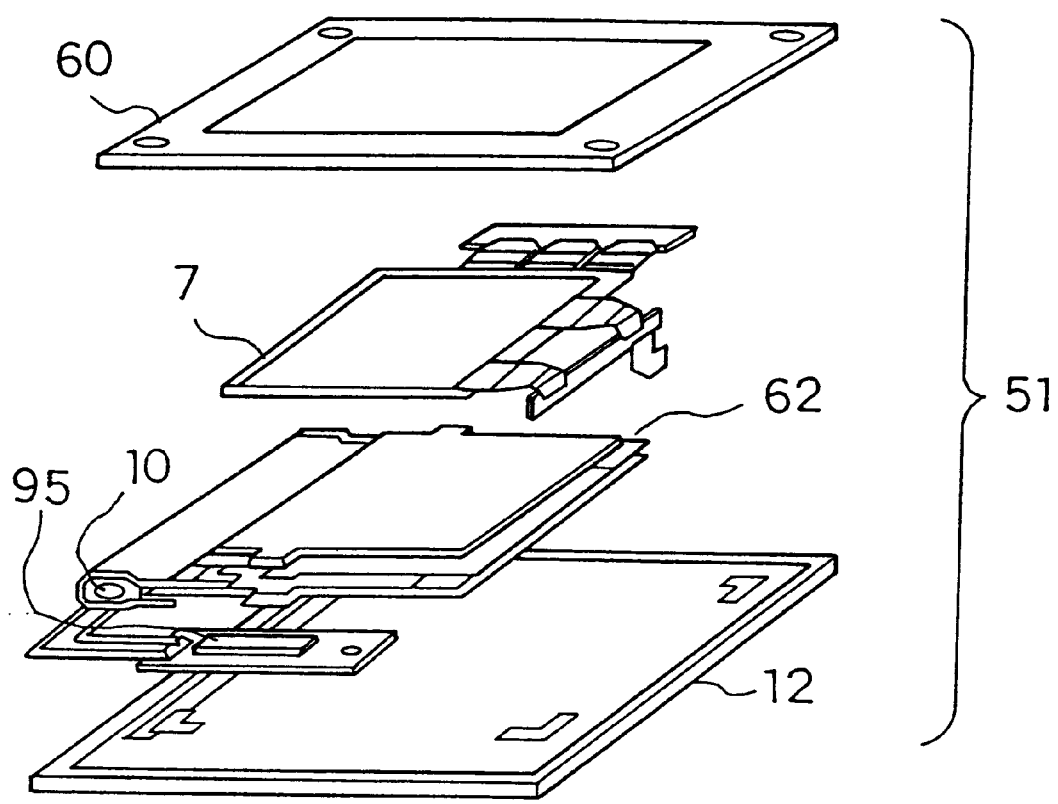
FIG. 56 is a disintegrated side view of the lid.
Figure 57:
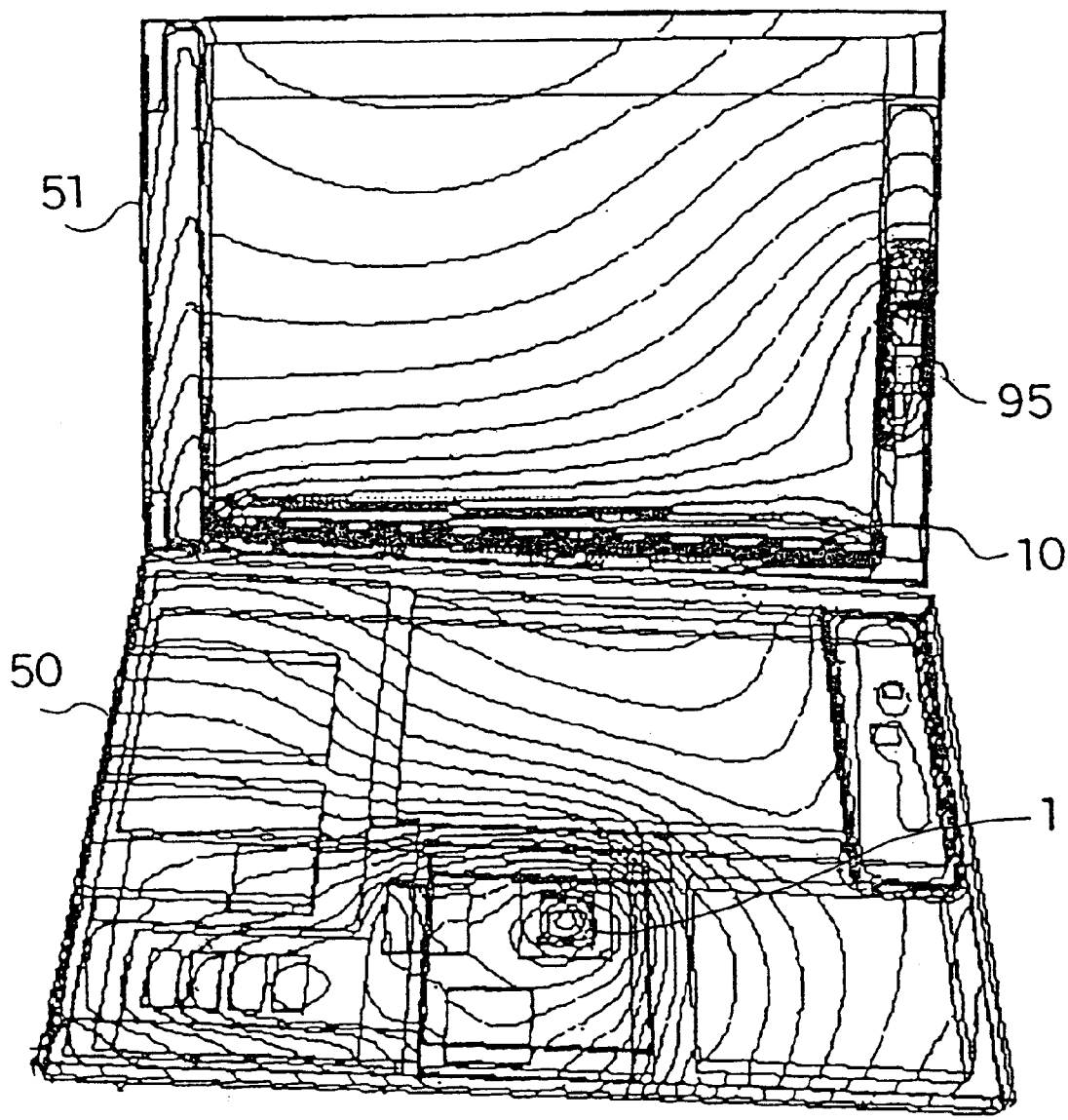
FIG. 57 is a temperature profile of the lid and the main body.
Figure 58:
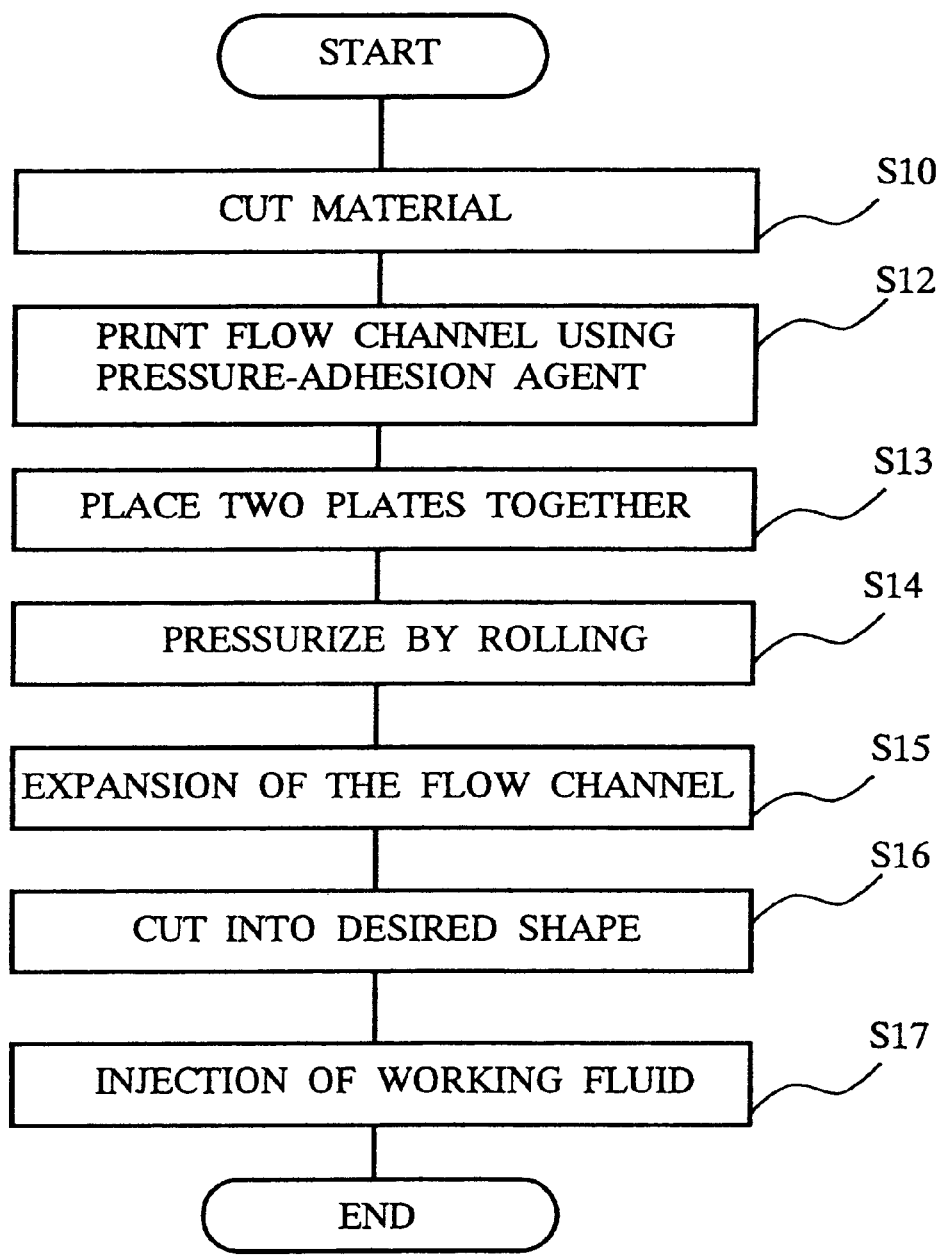
FIG. 58 is a flow chart illustrating a manufacturing method of the conventional thermo-siphon.
Figure 59:
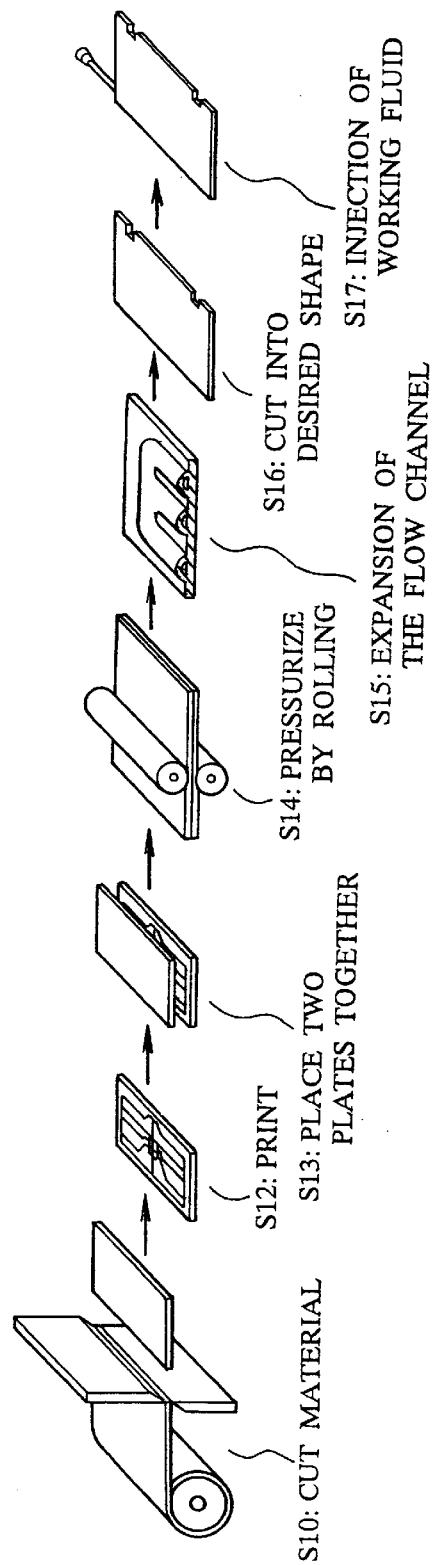
FIG. 59 is a flow chart illustrating a manufacturing method of the conventional thermo-siphon.

A configuration to sandwich a thermally conductive sheet in between the heat spreading board and the liquid crystal display panel is described, along with its advantage, with reference to FIG. 54.

It is desirable to use an elastic material with a good thermal conductivity as the thermally conductive sheet 11 such as silicon and rubber. By using the elastic material, for components such as the liquid crystal display panel 7 and the heat spreading board 5, as well as the liquid crystal display panel 7 and the thermo-siphon 6 will be adhered together without allowing a gap in between them. The reason for using the elastic material is because the elastic material absorbs and fills-in the dents on a surface of the thermo-siphon which is formed by the vapor flow channels, so that the components will be adhered together without allowing any gap in between them.

Also, on one side of the liquid crystal display panel 7, a high frequency inverter circuit board 95 is placed. The high frequency inverter circuit board 95 has a circuit for turning on the back light. The thermally conductive sheet is used as an insulating sheet, which prevents the leakage current to flow from the high frequency inverter circuit board 95 to the chassis 12 or to the heat spreading board 5. That is, the leakage current is insulated by the insulating sheet, and the current will not flow to the chassis 12 or to the heat spreading board 5.

In the previously described example, the thermally conductive and insulating sheet is used, however, only the thermally conductive sheet may be used. Or, the insulating sheet only may be used.

The invention can be applied not only to the notebook type personal computer but also can be applied to others such as hand-held information processing apparatus, mobile telephones and mobile facsimile machines.

As described above, according to embodiment 2 of the present invention, since the heat spreading board is exposed at outer plane of the lid, therefore, the heat generated at the heat generation unit can effectively be released outside. As a result of this, even if an amount of heat generation from the heat generation unit is large, temperature inside the main body can be maintained at a low temperature. Also, with the thinning of the main body, even if there is almost no space at all inside the main body to let go of the heat, the heat is released to the outside, through the heat spreading board, and the temperature inside the main body is maintained low.

Also, according to embodiment 2 of the present invention, since an exposed plane of the heat spreading board is painted to form the foaming paint layer, the exposed plane of the heat spreading board will be rough such that an area where a hand touches this exposed surface declines. As a result of this, an amount of heat from the heat spreading board transferred to hand decreases, and the touching warmth at the exposed plane of the heat spreading board improves.

Further, according to embodiment 2 of the present invention, since the thermally conductive material is installed at the main body, the heat generated at the heat generation unit is released from both the exposed plane of the heat spreading board and a rear plane of the main body. As such, compared to the conventional heat spreading, an area of plane for releasing heat is twice as much, therefore, the heat generated at the heat generation unit is effectively released to outside.

Furthermore, according to embodiment 2 of the present invention, since a rear plane of the main body is painted to form the foaming paint layer, the rear plane of the main body will be rough such that the area of the rear plane surface touched by a hand decreases. As a result of this, an amount of heat from the main body transferred to the hand decreases, and the touching warmth at the rear plane of the heat spreading board increases.

Furthermore, according to embodiment 2 of the present invention, since a frame is installed at a periphery of the heat spreading board, which is easily processed compared to the heat spreading board, the processing at the lid becomes easy. As a result of this, an outline of the lid can have a designing property, in addition, it becomes easy to take corners of the lid.

Furthermore, according to embodiment 2 of the present invention, since the coefficient of thermal expansion for the heat spreading board and the frame is identical, even if the temperature of the heat spreading board and the frame by the heat spreading process increases, the heat spreading board or the frame will not bend backward or shrink.

Furthermore, according to embodiment 2 of the present invention, since an additive is being mixed into the heat spreading board, in accordance to the coefficient of thermal expansion of the frame, the coefficient of thermal expansion of the heat spreading board is adjusted. As a result of this, the coefficient of thermal expansion of the heat spreading board and the lid is identical, and even if the temperature of the heat spreading board or the lid increased by the heat spreading process, the heat spreading board or the frame will not bend backward or shrink.

Furthermore, according to embodiment 2 of the present invention, since aluminum having a good conductivity is being used as a material to form the heat spreading board, the heat generated at the heat generation unit is efficiently released to the outside. Also, since magnesium which is easily processed is being used as a material to form the frame, an outline of the lid can have a designing property, in addition, it becomes easy to take corners of the lid.

Furthermore, according to embodiment 2 of the present invention, since the heat spreading board and the liquid crystal display panel are attached together, the heat from the liquid crystal display panel is conducted to the heat spreading board, and the temperature at various positions of the liquid crystal display panel is equalized. As a result of this, a color inconsistency due to temperature variation at various positions of the liquid crystal display panel is prevented, and a visibility of the liquid crystal display panel improves. Particularly, due to the heat of back light which is placed at a side of the liquid crystal display panel, the temperature at various positions of the liquid crystal display panel is variable, however, because the heat spreading board equalizes temperature of the liquid crystal display panel, the color inconsistency of the liquid crystal display panel is effectively prevented.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A thermo-siphon, comprising:
   a heat spreading board; and
   a flow channel for circulating a working fluid;
   wherein the heat spreading board includes a thick part and a thin part, and
   the heat spreading board is a combined plate of a first plate and a second plate,
   wherein the first plate is a flat board and the second plate has a lacking part.

2. The thermo-siphon according to claim 1, wherein the heat spreading board is arranged to place the thick part closer to the flow channel than the thin part.

3. The thermo-siphon according to claim 2, wherein the flow channel forms a closed loop, wherein the thick part is formed at an inner periphery of the closed loop, and wherein the thin part is formed at an inner side of the thick part.

4. The thermo-siphon according to claim 1, wherein one of the plates from the first plate and the second plate is larger than the other one of the plates, and a protruded edge of one of the plates is bent.

5. The thermo-siphon according to claim 1, wherein the first plate and the second plate have different thickness.

6. The thermo-siphon according to claim 1, wherein the thermo-siphon is used in spreading heat of an electronic device.

7. The thermo-siphon according to claim 7, wherein the electronic device comprises a main body having a heat generation unit, and a lid covering the main body, and wherein the thermo-siphon is installed on the lid.

8. A thermo-siphon, comprising:
   a heat spreading board; and
   a flow channel for circulating a working fluid;
   wherein the heat spreading board includes a thick part and a thin part,
   wherein the heat spreading board is arranged to place the thick part closer to the flow channel than the thin part,
   wherein the flow channel forms a closed loop, wherein the thick part is formed at an inner periphery of the closed loop, and wherein the thin part is formed at an inner side of the thick part.

* * * * *